United States Patent
Maekawa

(10) Patent No.: US 8,399,930 B2
(45) Date of Patent: Mar. 19, 2013

(54) METHOD OF MANUFACTURING A SEMICONDUCTOR DEVICE HAVING A CONTACT PLUG

(75) Inventor: Atsushi Maekawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/360,850

(22) Filed: Jan. 30, 2012

(65) Prior Publication Data

US 2012/0129339 A1 May 24, 2012

Related U.S. Application Data

(63) Continuation of application No. 12/545,433, filed on Aug. 21, 2009, now Pat. No. 8,129,791.

(30) Foreign Application Priority Data

Aug. 22, 2008 (JP) .................................. 2008-213713

(51) Int. Cl.
*H01L 21/70* (2006.01)
(52) U.S. Cl. . 257/368; 257/213; 257/773; 257/E29.255; 257/E21.585; 438/640; 438/666
(58) Field of Classification Search ............... 257/213, 257/368, 773, E29.255, E21.585, E23.011; 438/640, 666
See application file for complete search history.

(56) References Cited

U.S. PATENT DOCUMENTS

| | | | |
|---|---|---|---|
| 4,656,732 A | 4/1987 | Teng et al. | |
| 5,248,628 A | 9/1993 | Okabe et al. | |
| 5,378,906 A | 1/1995 | Lee | |
| 5,406,103 A | 4/1995 | Ogawa | |
| 5,861,345 A * | 1/1999 | Chou et al. | 438/763 |
| 5,864,172 A * | 1/1999 | Kapoor et al. | 257/634 |
| 5,963,827 A | 10/1999 | Enomoto et al. | |
| 6,140,227 A | 10/2000 | Chen et al. | |
| 6,162,583 A * | 12/2000 | Yang et al. | 430/313 |
| 6,168,985 B1 | 1/2001 | Asano et al. | |
| 6,184,118 B1 | 2/2001 | Chung et al. | |
| 6,194,758 B1 | 2/2001 | Tanaka et al. | |
| 6,228,735 B1 * | 5/2001 | Lee | 438/384 |
| 6,266,110 B1 | 7/2001 | Mizuno et al. | |
| 6,277,757 B1 * | 8/2001 | Lin | 438/704 |
| 6,281,073 B1 | 8/2001 | Lee | |
| 6,300,683 B1 * | 10/2001 | Nagasaka et al. | 257/774 |
| 6,372,631 B1 | 4/2002 | Wang et al. | |
| 6,396,096 B1 | 5/2002 | Park et al. | |
| 6,444,573 B1 | 9/2002 | Wang et al. | |
| 6,448,177 B1 * | 9/2002 | Morrow et al. | 438/638 |
| 6,455,411 B1 * | 9/2002 | Jiang et al. | 438/624 |
| 6,472,124 B1 | 10/2002 | Chung | |

(Continued)

FOREIGN PATENT DOCUMENTS

JP 2008-072132 3/2008

*Primary Examiner* — N Drew Richards
*Assistant Examiner* — Ankush Singal
(74) *Attorney, Agent, or Firm* — Young & Thompson

(57) ABSTRACT

There is provided a semiconductor device that includes: a transistor having a gate electrode, a source region, and a drain region; a first inter-layer insulation film covering the transistor; a first contact plug formed penetrating through the first inter-layer insulation film and connected to either the source region or the drain region; a second inter-layer insulation film covering the first contact plug; a groove extending in the second inter-layer insulation film in a same direction as an extending direction of the gate electrode and exposing a top surface of the first contact plug at a bottom thereof; a second contact plug connected to the first contact plug and formed in the groove; and a wiring pattern extending on the second inter-layer insulation film so as to traverse the groove and integrated with the second contact plug.

16 Claims, 31 Drawing Sheets

U.S. PATENT DOCUMENTS

| | | |
|---|---|---|
| 6,472,700 B2 | 10/2002 | Wakao et al. |
| 6,476,447 B1 | 11/2002 | Yamazaki et al. |
| 6,528,368 B1 | 3/2003 | Park |
| 6,737,314 B2 * | 5/2004 | Kunikiyo ............. 438/241 |
| 6,787,458 B1 | 9/2004 | Tripsas et al. |
| 6,929,999 B2 | 8/2005 | Park et al. |
| 7,026,679 B2 * | 4/2006 | Uchiyama et al. ......... 257/303 |
| 7,118,957 B2 | 10/2006 | Hayashi et al. |
| 7,121,835 B2 | 10/2006 | Silva |
| 7,189,597 B2 * | 3/2007 | Pyi ................... 438/118 |
| 7,273,807 B2 | 9/2007 | Park |
| 7,338,884 B2 * | 3/2008 | Shimoto et al. ......... 438/459 |
| 7,345,346 B2 | 3/2008 | Hoshizaki et al. |
| 7,399,671 B2 * | 7/2008 | Burgess et al. ......... 438/253 |
| 7,449,375 B2 * | 11/2008 | Morikado ............. 438/151 |
| 7,459,798 B2 | 12/2008 | Chang |
| 7,547,628 B2 | 6/2009 | Ikeda |
| 7,648,875 B2 * | 1/2010 | Hong et al. ........... 438/253 |
| 7,741,213 B2 * | 6/2010 | Ema ................. 438/622 |
| 7,763,542 B2 | 7/2010 | Kim et al. |
| 7,807,567 B2 * | 10/2010 | Kawano et al. ......... 438/640 |
| 2001/0045652 A1 | 11/2001 | Mori et al. |
| 2001/0045658 A1 * | 11/2001 | Deboer et al. ......... 257/758 |
| 2002/0008323 A1 | 1/2002 | Watanabe et al. |
| 2003/0202397 A1 | 10/2003 | Saito et al. |
| 2003/0222293 A1 | 12/2003 | Noro |
| 2004/0166596 A1 | 8/2004 | Sashida et al. |
| 2004/0229428 A1 * | 11/2004 | Cho et al. ............ 438/253 |
| 2004/0262771 A1 | 12/2004 | Kohyama et al. |
| 2005/0082674 A1 | 4/2005 | Seta et al. |
| 2005/0270845 A1 | 12/2005 | Takahashi |
| 2006/0017070 A1 | 1/2006 | Ikoma et al. |
| 2006/0022243 A1 | 2/2006 | Hashidzume et al. |
| 2006/0157752 A1 * | 7/2006 | Suzuki .............. 257/288 |
| 2006/0264047 A1 | 11/2006 | Kim et al. |
| 2007/0020975 A1 | 1/2007 | Chung et al. |
| 2007/0123040 A1 | 5/2007 | Hwang et al. |
| 2007/0210306 A1 | 9/2007 | Molinelli Acocella et al. |
| 2007/0232005 A1 * | 10/2007 | Maruyama et al. ....... 438/299 |
| 2007/0268746 A1 * | 11/2007 | Choi et al. ........ 365/185.05 |
| 2008/0179746 A1 | 7/2008 | Hur et al. |
| 2008/0268381 A1 | 10/2008 | Saito et al. |
| 2009/0014710 A1 | 1/2009 | Kawashima et al. |
| 2009/0104749 A1 * | 4/2009 | Sung et al. ............ 438/396 |

* cited by examiner

METHOD OF MANUFACTURING A SEMICONDUCTOR DEVICE HAVING A CONTACT PLUG

CROSS REFERENCE TO RELATED APPLICATION

This application is a continuation of co-pending application Ser. No. 12/545,433 filed Aug. 21, 2009, which claims foreign priority to Japanese patent application 2008-21373 filed Aug. 22, 2008. The entire content of each of these applications is hereby incorporated by reference.

BACKGROUND OF THE INVENTION

1. Field of the Invention

The present invention relates to a semiconductor device and a manufacturing method thereof, and, particularly to a semiconductor device in which a plurality of contact plugs are closely formed and a manufacturing method thereof.

2. Description of Related Art

A number of transistors in a semiconductor device are formed on a silicon substrate. Source regions and drain regions of the transistors are connected to wiring patterns or various elements formed on upper layers via various contact electrodes. For example, either the source region or the drain region of a cell transistor are connected to bit line via a cell contact plug and a bit contact plug in a DRAM (Dynamic Random Access Memory), which is a typical semiconductor device (see Japanese Patent Application Laid-open No. 2008-72132).

FIGS. 26 to 31 are process diagrams for explaining a general method of connecting either the source regions or the drain regions in a DRAM to bit lines. FIGS. 26A, 28A, and 30A are schematic plan views in each process, FIGS. 26B, 28B, and 30B are schematic cross-sectional views taken along a line X-X in each of the plan views, FIGS. 27A, 29A, and 31A are schematic cross-sectional views taken along a line Y-Y in each of the plan views, and FIGS. 27B, 29B, and 31B are schematic cross-sectional views taken along a line Z-Z in each of the plan views.

As shown in FIGS. 26A, 26B, 27A and 27B, a plurality of transistors are formed by forming a plurality of gate electrodes 31, and a plurality of source regions and drain regions 32 on a semiconductor substrate 300. After forming a cap insulation film 33 composed of a silicon nitride film covering the side and top surfaces of each gate electrode 31, a first inter-layer insulation film 34 covering the plurality of transistors is formed. Cell contact plugs 35 connected to either the source regions or the drain regions 32 are formed in the inter-layer insulation film 34, and a second inter-layer insulation film 36 is formed thereon. Subsequently, a plurality of contact holes 37 exposing the top surfaces of the cell contact plugs 35 are formed in the inter-layer insulation film 36. As shown in FIGS. 28A, 28B, 29A and 29B, an conductive material filling the plurality of contact holes 37 is formed, which is flattened by CMP (Chemical Mechanical Polishing) to form a plurality of bit contact plugs 38. By patterning the conductive material, subsequent to formation thereof on the bit contact plugs 38, a plurality of bit lines 39 are formed, each of which connecting to each bit contact plug 38, as shown in FIGS. 30A, 30B, 31A and 31B.

With a manufacturing method shown in FIGS. 26A to 31B, there has been a possibility of short-circuiting between adjacent contact plugs 38 as the array pitch of the bit contact plugs 38 (contact holes 37) become very narrow due to progress of high integration. Therefore, there has been a problem that a very high precision is required for lithography and patterning (etching) to form the contact holes 37.

While conventional problems related to the present invention have been explained above by exemplifying a memory cell of a DRAM, these problems can similarly occur to other semiconductor devices.

SUMMARY

The present invention seeks to solve one or more of the above problems, or to improve upon those problems at least in part.

In one embodiment, there is provided a semiconductor device that includes: a transistor having a gate electrode, a source region, and a drain region; a first inter-layer insulation film covering the transistor; a first contact plug formed penetrating through the first inter-layer insulation film and connected to either the source region or the drain region; a second inter-layer insulation film covering the first contact plug; a groove extending in the second inter-layer insulation film in a same direction as an extending direction of the gate electrode and exposing a top surface of the first contact plug at a bottom thereof; a second contact plug connected to the first contact plug and formed in the groove; and a wiring pattern extending on the second inter-layer insulation film so as to traverse the groove and integrated with the second contact plug.

In one embodiment, there is provided a manufacturing method of a semiconductor device that includes: forming a transistor having a gate electrode, a source region, and a drain region; forming a first inter-layer insulation film covering the transistor; forming a first contact plug penetrating through the first inter-layer insulation film and connected to either the source region or the drain region; forming a second inter-layer insulation film covering the first contact plug; forming a groove extending in the second inter-layer insulation film in a same direction as an extending direction of the gate electrode and exposing a top surface of the first contact plug at a bottom thereof; forming an conductive material in the groove and on the second inter-layer insulation film; and patterning the conductive material on the second inter-layer insulation film and the conductive material in the groove using a mask to form a second contact plug connected to the first contact plug and a wiring pattern extending on the second inter-layer insulation film so as to traverse the groove, the wiring pattern being integrated with the second contact plug.

According to the present invention, the groove extending in the same direction as that of the extending gate electrodes and exposing the top surface of the first contact plugs at the bottom is formed on the second inter-layer insulation film, and the second contact plugs connected to the first contact plugs are formed in the groove. That is, the second contact plugs can be formed by patterning the conductive material after the conductive material is formed in the groove. Therefore, lithography and patterning (etching) can be easily performed even if the array pitch of the second contact plugs is narrow, because the formation of minute contact holes is not required when forming the second contact plugs.

Furthermore, because the second contact plugs and the wiring patterns integrated with the second contact plugs can be formed by forming the conductive material in the groove and on the second inter-layer insulation film and patterning the same, the formation of the conductive material or CMP in order to form the second contact plugs can be eliminated and simplifying the manufacturing process thereby.

BRIEF DESCRIPTION OF THE DRAWINGS

The above features and advantages of the present invention will be more apparent from the following description of certain preferred embodiments taken in conjunction with the accompanying drawings, in which:

FIG. 1A is a schematic plan view, FIG. 1B is a schematic cross-sectional view along a line A-A in FIG. 1A;

FIG. 2A is a schematic cross-sectional view along a line B-B in FIG. 1A, and FIG. 2B is a schematic cross-sectional view along a line C-C in FIG. 1A;

FIG. 3A is a schematic plan view, and FIG. 3B is a schematic cross-sectional view taken along a line A-A in FIG. 3A;

FIG. 4A is a cross-sectional view taken along a line B-B in FIG. 3A, and FIG. 4B is a schematic cross-sectional view taken along a line C-C in FIG. 3A;

FIG. 5A is a schematic plan view, and FIG. 5B is a schematic cross-sectional view taken along a line A-A in FIG. 5A;

FIG. 6A is a cross-sectional view taken along a line B-B in FIG. 5A, and FIG. 6B is a schematic cross-sectional view taken along a line C-C in FIG. 5A;

FIG. 7A is a schematic plan view, and FIG. 7B is a schematic cross-sectional view taken along a line A-A in FIG. 7A;

FIG. 8A is a cross-sectional view taken along a line B-B in FIG. 7A, and FIG. 8B is a schematic cross-sectional view taken along a line C-C in FIG. 7A;

FIG. 9A is a schematic plan view, and FIG. 9B is a schematic cross-sectional view taken along a line A-A in FIG. 9A;

FIG. 10A is a cross-sectional view taken along a line B-B in FIG. 9A, and FIG. 10B is a schematic cross-sectional view taken along a line C-C in FIG. 9A;

FIG. 11A is a schematic plan view, and FIG. 11B is a schematic cross-sectional view taken along a line A-A in FIG. 11A;

FIG. 12A is a cross-sectional view taken along a line B-B in FIG. 11A, and FIG. 12B is a schematic cross-sectional view taken along a line C-C in FIG. 11A;

FIG. 13A is a schematic plan view, and FIG. 13B is a schematic cross-sectional view taken along a line A-A in FIG. 13A;

FIG. 14A is a cross-sectional view taken along a line B-B in FIG. 13A, and FIG. 14B is a schematic cross-sectional view taken along a line C-C in FIG. 13A;

FIG. 16A is a schematic plan view, FIG. 16B is a schematic cross-sectional view along a line D-D in FIG. 16A, FIGS. 17A and 17B show the structure of the semiconductor device 200 according to the first embodiment of the invention, where

FIG. 18A is a schematic plan view, and FIG. 18B is a schematic cross-sectional view taken along a line D-D in FIG. 18A;

FIG. 19A is a cross-sectional view taken along a line E-E in FIG. 18A, and FIG. 19B is a schematic cross-sectional view taken along a line F-F in FIG. 18A;

FIG. 20A is a schematic plan view, and FIG. 20B is a schematic cross-sectional view taken along a line D-D in FIG. 20A;

FIG. 21A is a cross-sectional view taken along a line E-E in FIG. 20A, and FIG. 21B is a schematic cross-sectional view taken along a line F-F in FIG. 20A;

FIG. 22A is a schematic plan view, and FIG. 22B is a schematic cross-sectional view taken along a line D-D in FIG. 22A;

FIG. 23A is a cross-sectional view taken along a line E-E in FIG. 22A, and FIG. 23B is a schematic cross-sectional view taken along a line F-F in FIG. 22A;

FIG. 24A is a schematic plan view, and FIG. 24B is a schematic cross-sectional view taken along a line D-D in FIG. 24A;

FIG. 25A is a cross-sectional view taken along a line E-E in FIG. 24A, and FIG. 25B is a schematic cross-sectional view taken along a line F-F in FIG. 24A;

FIG. 26A is a schematic plan view, and FIG. 26B is a schematic cross-sectional view taken along a line X-X in FIG. 26A;

FIG. 27A is a cross-sectional view taken along a line Y-Y in FIG. 26A, and FIG. 27B is a schematic cross-sectional view taken along a line Z-Z in FIG. 26A;

FIG. 28A is a schematic plan view, and FIG. 28B is a schematic cross-sectional view taken along a line X-X in FIG. 28A;

FIG. 29A is a cross-sectional view taken along a line Y-Y in FIG. 28A, and FIG. 29B is a schematic cross-sectional view taken along a line Z-Z in FIG. 28A;

FIG. 30A is a schematic plan view, and FIG. 30B is a schematic cross-sectional view taken along a line X-X in FIG. 30A; FIG. 31A is a cross-sectional view taken along a line Y-Y in FIG. 30A, and FIG. 31B is a schematic cross-sectional view taken along a line Z-Z in FIG. 30A.

DETAILED DESCRIPTION OF THE EMBODIMENTS

Figure 1A:
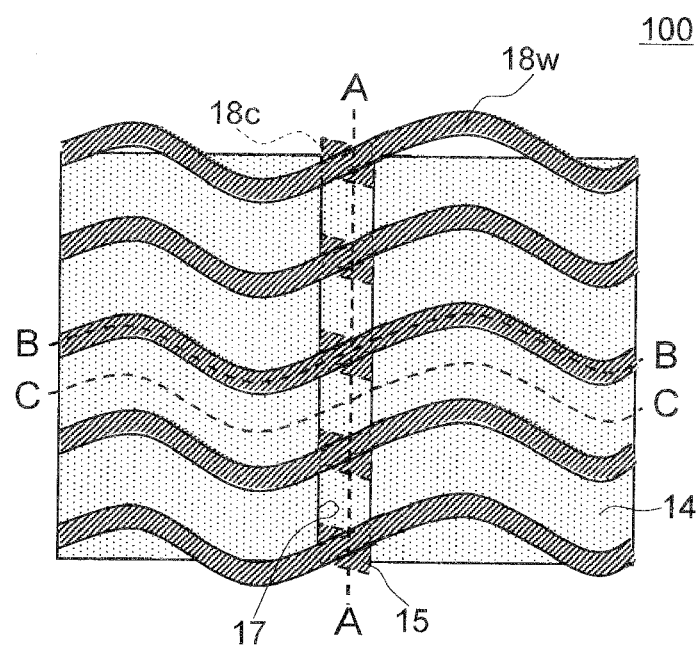
FIGS. 1A and 1B show the structure of a semiconductor device 100 according to a first embodiment of the invention, where
Figure 1B:
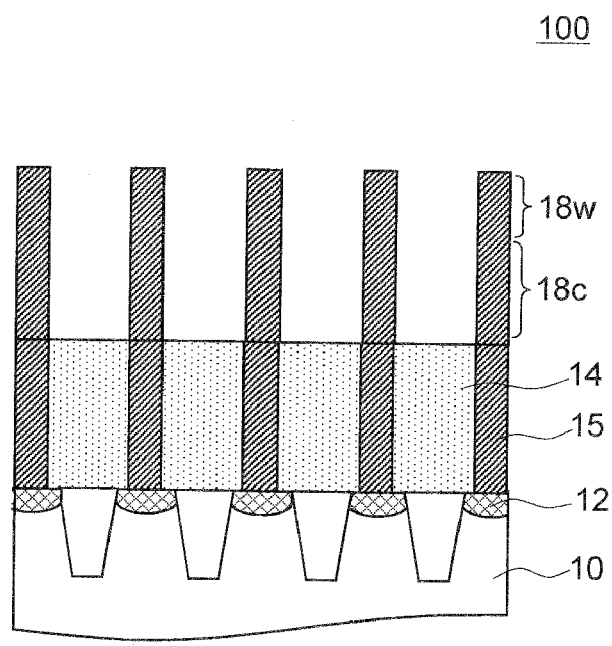
Figure 2A:
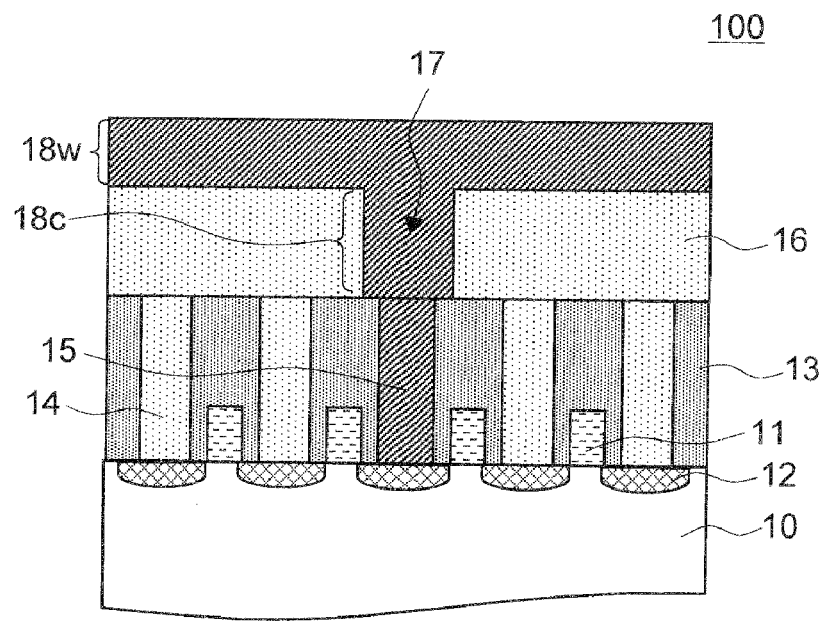
FIGS. 2A and 2B show the structure of the semiconductor device 100 according to the first embodiment of the invention, where
Figure 2B:
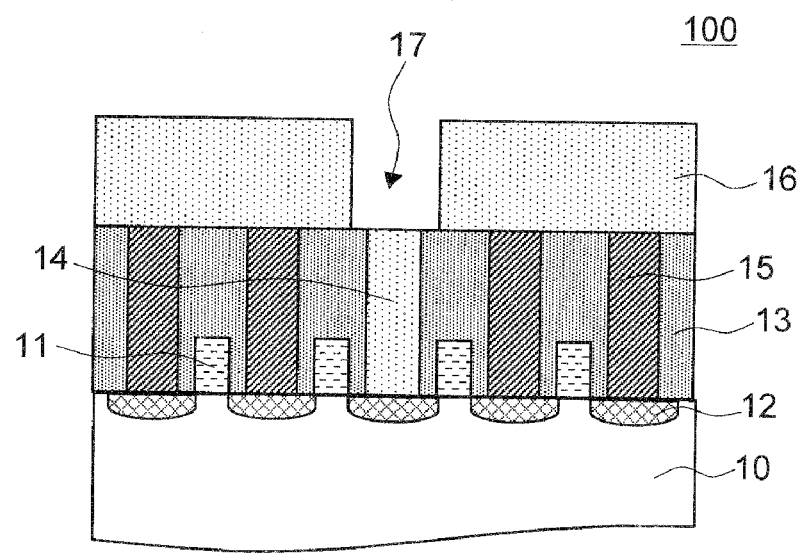
Figure 3A:
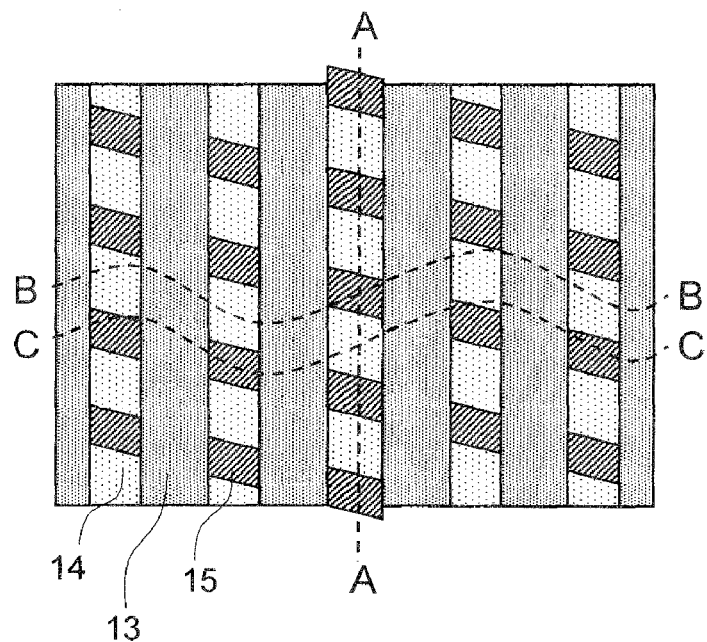
FIGS. 3A and 3B show a manufacturing process of the semiconductor device 100 (forming of a first contact plug), where
Figure 3B:
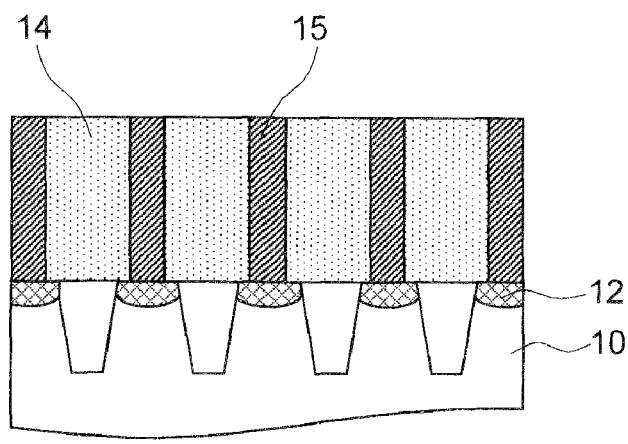
Figure 4A:
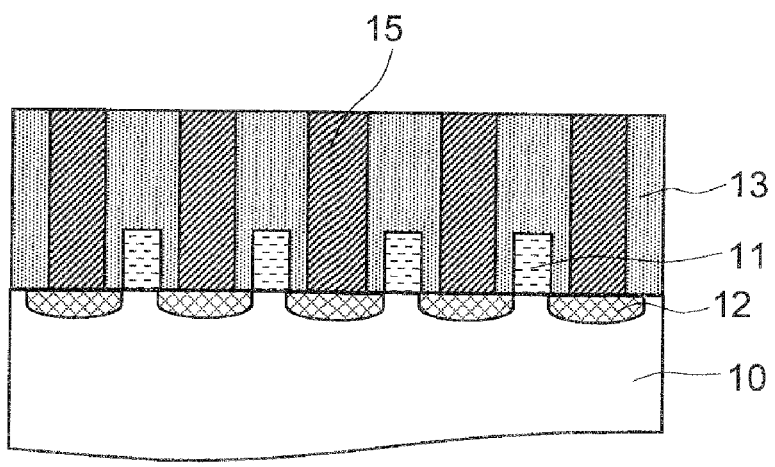
FIGS. 4A and 4B show the manufacturing process of the semiconductor device 100 (forming of the first contact plug 15), where
Figure 4B:
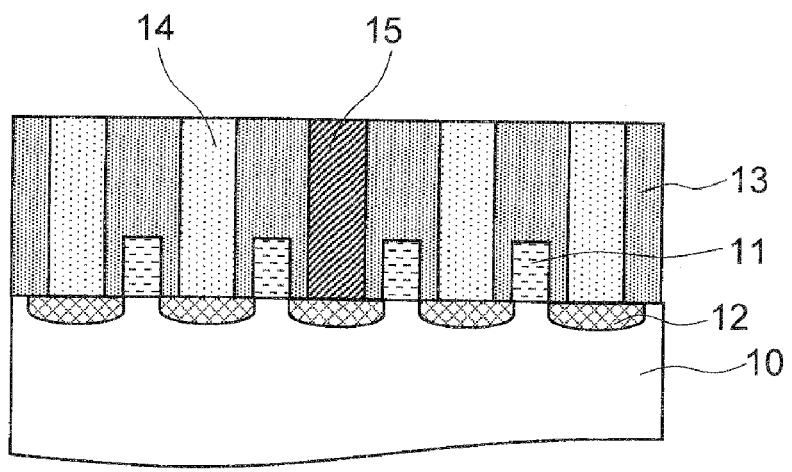
Figure 5A:
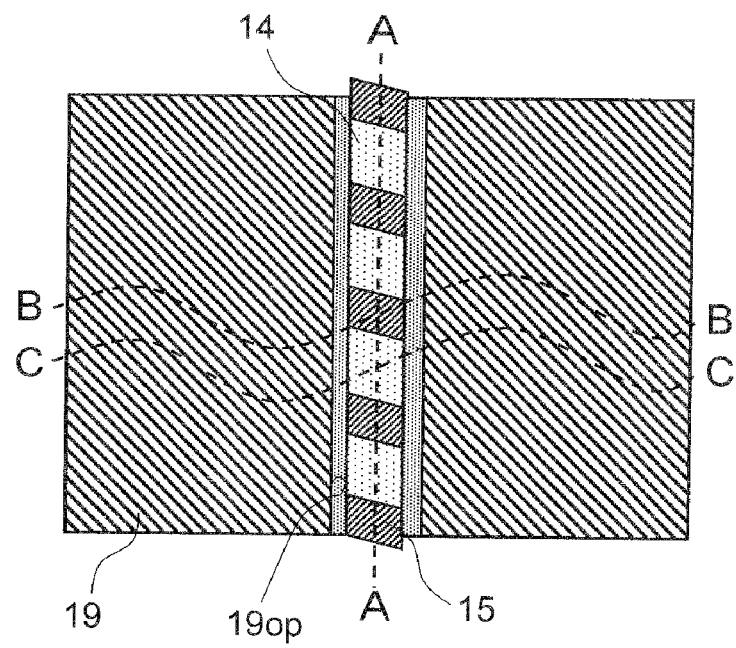
FIGS. 5A and 5B show a manufacturing process of the semiconductor device 100 (forming of a resist mask 19), where
Figure 5B:
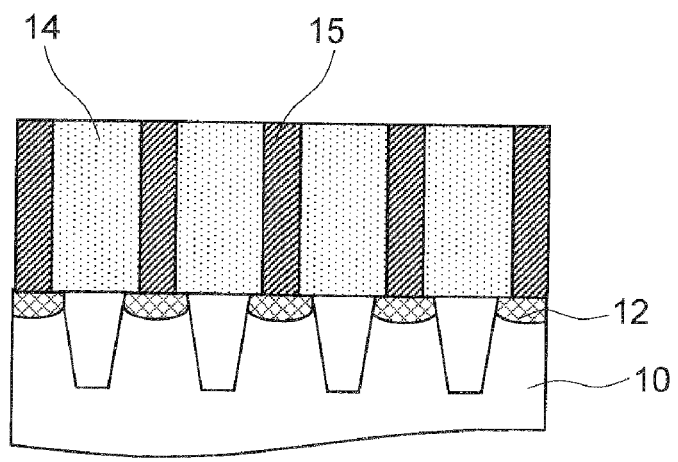
Figure 6A:
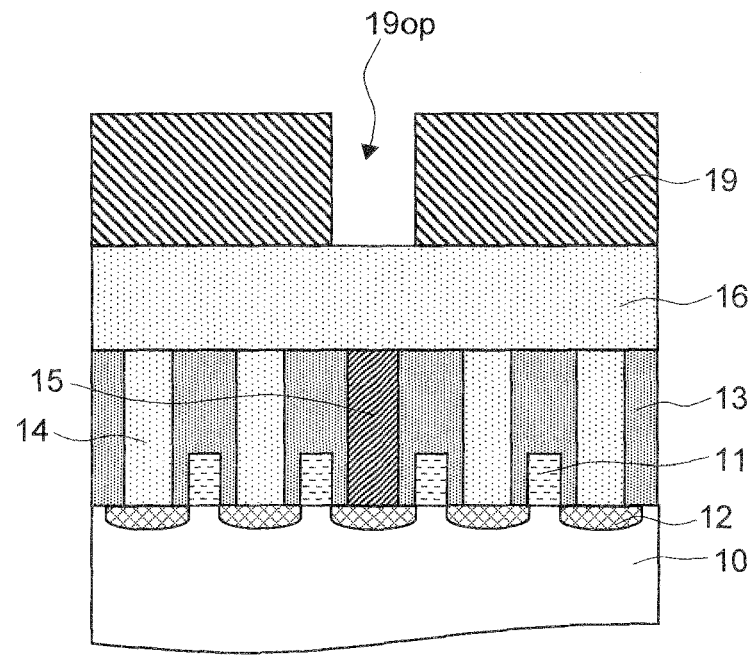
FIGS. 6A and 6B show the manufacturing process of the semiconductor device 100 (forming of the resist mask 19), where
Figure 6B:
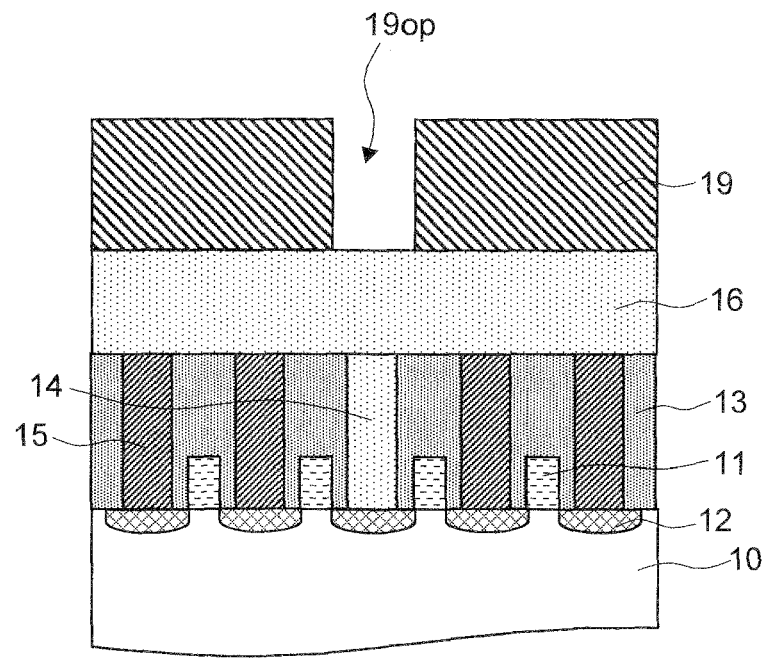
Figure 7A:
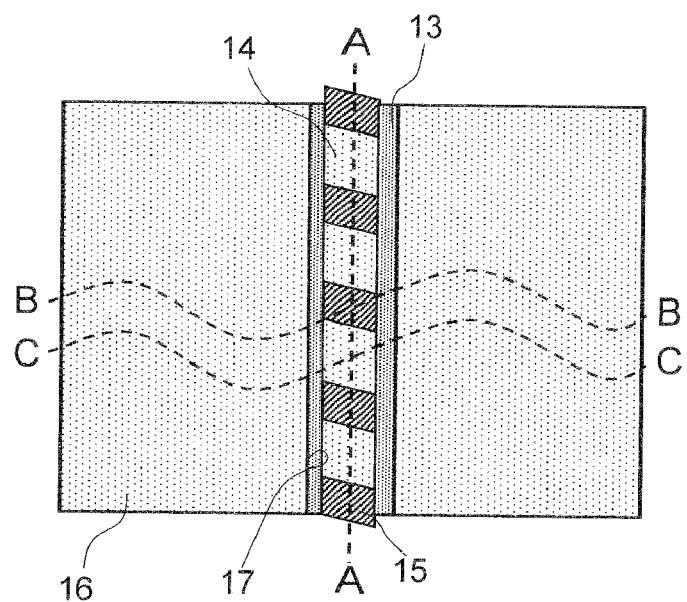
FIGS. 7A and 7B show a manufacturing process of the semiconductor device 100 (forming of a groove 17), where
Figure 7B:
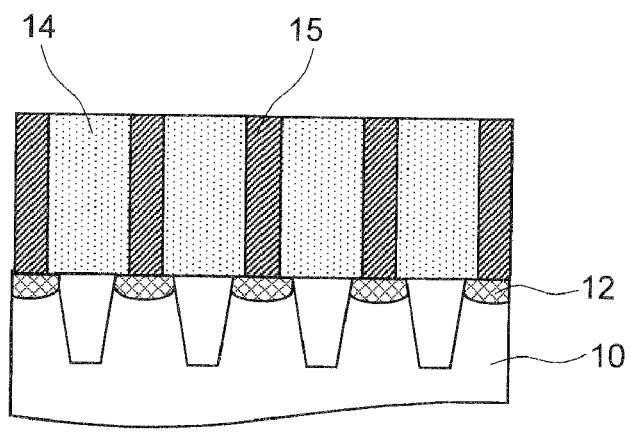
Figure 8A:
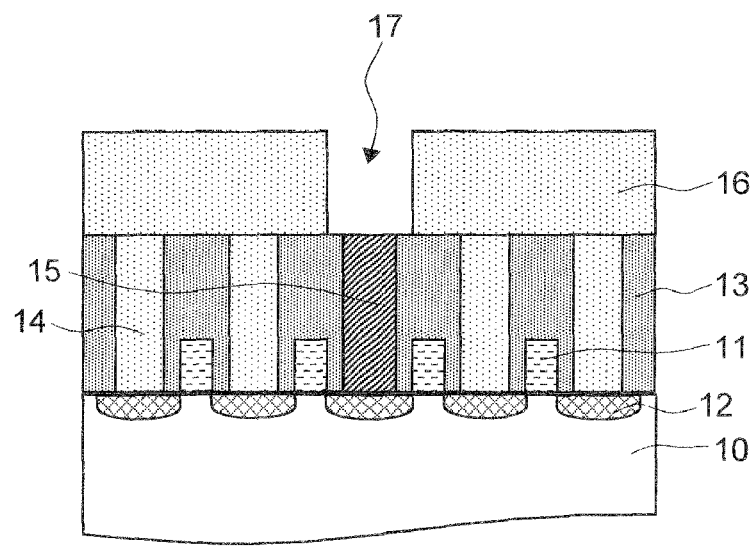
FIGS. 8A and 8B show the manufacturing process of the semiconductor device 100 (forming of the groove 17), where
Figure 8B:
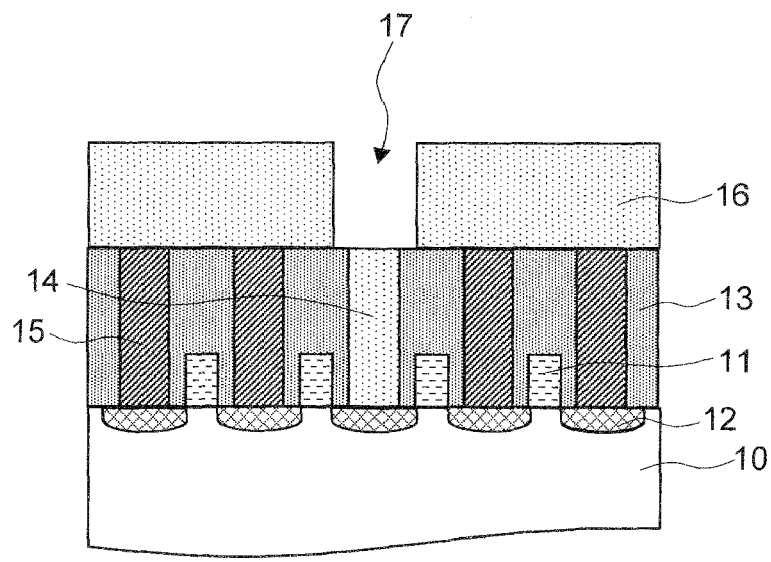
Figure 9A:
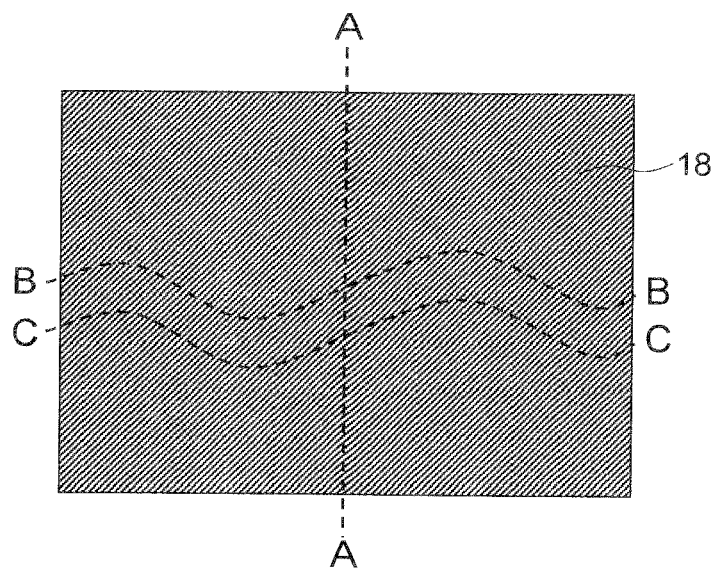
FIGS. 9A and 9B show a manufacturing process of the semiconductor device 100 (forming of an conductive material 18), where
Figure 9B:
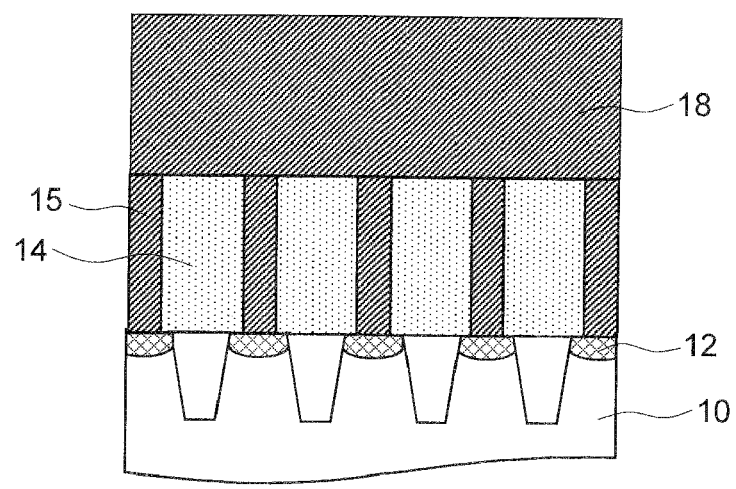
Figure 10A:
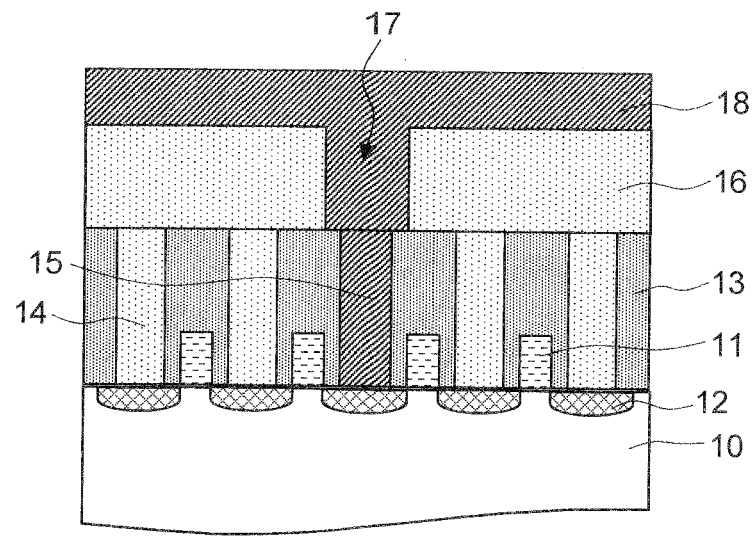
FIGS. 10A and 10B show the manufacturing process of the semiconductor device 100 (forming of the conductive material 18), where
Figure 10B:
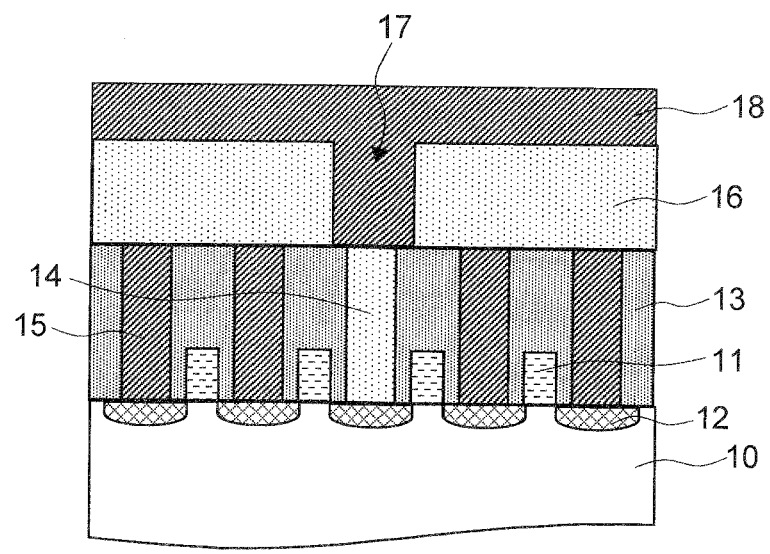
Figure 11A:
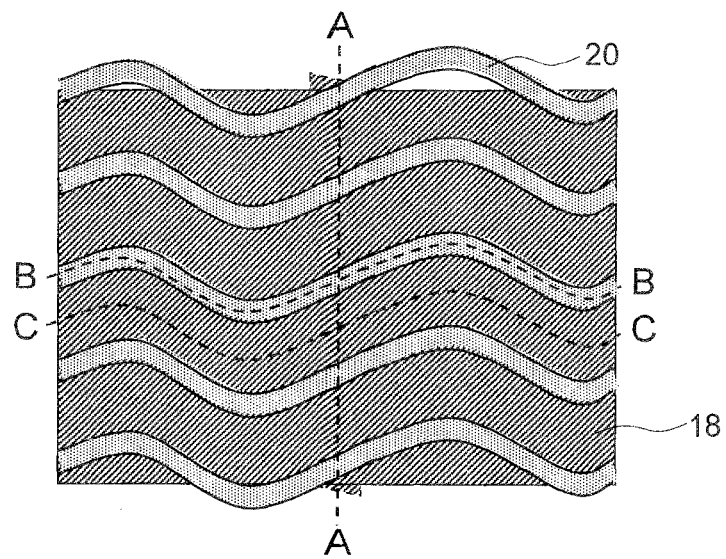
FIGS. 11A and 11B show a manufacturing process of the semiconductor device 100 (forming of a mask layer 20), where
Figure 11B:
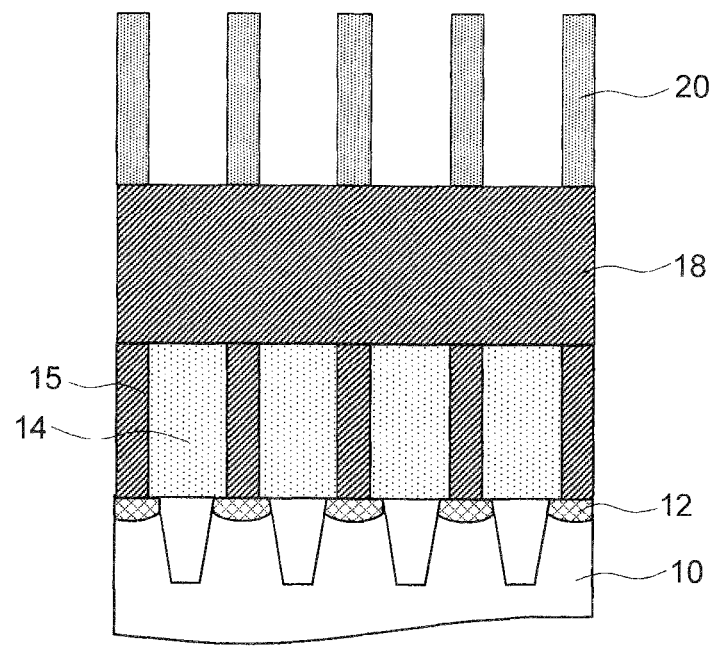
Figure 12A:
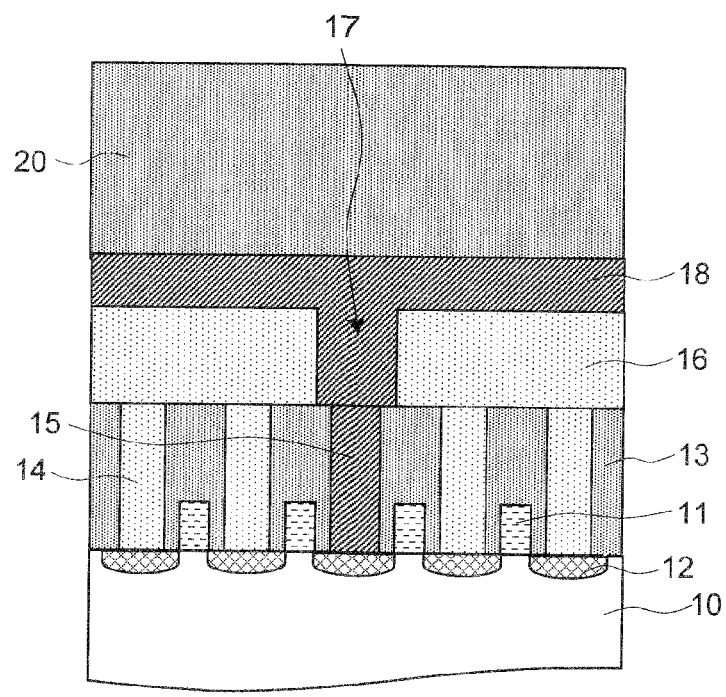
FIGS. 12A and 12B show the manufacturing process of the semiconductor device 100 (forming of the mask layer 20), where
Figure 12B:
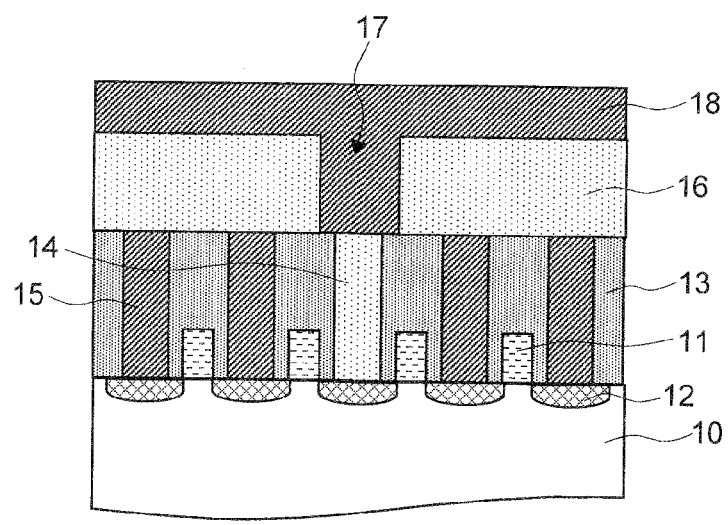

Preferred embodiments of the present invention will be explained below in detail with reference to the accompanying drawings.

First Embodiment

The semiconductor device 100 according to the first embodiment is a DRAM, with FIGS. 1A, 1B, 2A and 2B showing the structure when the formation of its bit lines 18$w$ is completed.

As shown in FIGS. 1A, 1B, 2A and 2B, the semiconductor device 100 according to the first embodiment includes a plurality of transistors each having a gate electrode 11 and a source region and a drain region 12 formed on a semiconductor substrate 10; first contact plugs (cell contact plugs) 15 connected to either the source regions or the drain regions 12, respectively; second contact plugs (bit contact plugs) 18$c$ connected to the first contact plugs 15, respectively; and wiring patterns 18$w$ connected to the second contact plugs 18$c$, respectively.

The side and top surfaces of each gate electrode 11 are covered with a silicon nitride film working as a cap insulation film 13. A silicon dioxide film working as a first inter-layer insulation film 14 is formed so as to cover the entire semiconductor substrate 10 including the cap insulation film 13. It is preferred that the thickness of the first inter-layer insulation film 14 is about 200 to 300 nm. The first contact plugs 15 are connected to either the source regions or the drain region 12, penetrating through the first inter-layer insulation film 14, respectively. A silicon dioxide film is formed on the first inter-layer insulation film 14 to work as a second inter-layer insulation film 16. A groove 17 linearly extending in the same direction as the extending direction of the gate electrodes 11 and exposing the top surface of the first contact plugs 15 at the bottom is formed on the second inter-layer insulation film 16. In the groove 17, a plurality of second contact plugs 18$c$ are arranged spaced apart from each other with a predetermined interval. Wiring patterns 18$w$ extend on the second inter-layer insulation film 16 so as to traverse the groove 17, and are integrated with the second contact plugs 18$c$.

The first contact plugs 15, the second contact plugs 18$c$, and the wiring patterns 18$w$ are formed by a conductive material, where W or W/WN film can be used, for example.

The manufacturing method of the semiconductor device 100 according to the first embodiment is explained below.

FIGS. 3A to 14B are process diagrams for explaining the manufacturing method of the semiconductor device 100 according to the first embodiment, where FIGS. 3A, 5A, 7A, 9A, 11A, and 13A are schematic plan views in each process, FIGS. 3B, 5B, 7B, 9B, 11B, and 13B are schematic cross-sectional views taken along a line A-A in each of the plan views, FIGS. 4A, 6A, 8A, 10A, 12A, and 14A are schematic cross-sectional views taken along a line B-B in each of the plan views, and FIGS. 4B, 6B, 8B, 10B, 12B, and 14B are schematic cross-sectional views taken along a line C-C in each of the plan views.

First, as shown in FIGS. 3A, 3B, 4A and 4B, the transistors are formed by forming the gate electrodes 11, and forming the source regions and drain regions 12 on the semiconductor substrate 10. After forming the cap insulation film 13 composed of the silicon nitride film covering the side and top surfaces of respective gate electrodes 11, the first inter-layer insulation film 14 covering the transistors is formed. The first contact plugs (cell contact plugs) 15 connected to either the source regions or drain regions 12 are formed on the inter-layer insulation film 14.

As shown in FIGS. 5A, 5B, 6A and 6B, the second inter-layer insulation film 16 is formed on the first inter-layer insulation film 14. Subsequently, the resist mask 19 is formed on the second inter-layer 16. The resist mask 19 is formed so as to have a groove-like opening 19op located over the cell contact plugs 15.

Subsequently, by patterning the second inter-layer insulation film 16 using the resist mask 19, the groove 17 linearly extending in the same direction as an extending direction of the gate electrodes 11 and exposing the top surface of the first contact plugs 15 at a bottom thereof is formed on the second inter-layer insulation film 16, as shown in FIGS. 7A, 7B, 8A and 8B.

As shown in FIGS. 9A, 9B, 10A and 10B, a conductive material 18 is then formed in the groove 17 and on the second inter-layer insulation film 16. Subsequently, as shown in FIGS. 11A, 11B, 12A and 12B, a mask layer 20 having plural patterns across the groove 17 is formed. It is preferable to use a silicon nitride film working as the material of the mask layer 20.

By patterning the conductive material 18 in the groove 17, as well as patterning the conductive material 18 on the second inter-layer insulation film 16, using the mask layer 20, wiring patterns (bit lines) 18$w$ that are patterned across the groove 17 and the second contact plugs (bit contact plugs) 18$c$ are simultaneously formed as shown in FIGS. 13A, 13B, 14A and 14B. According to the manner described above, the bit lines 18$w$ and the bit contact plugs 18$c$ are integrally formed.

The structure shown in FIGS. 1A, 1B, 2A and 2B can be subsequently obtained by removing the mask layer 20.

According to the first embodiment, it is possible to simultaneously fabricate the bit lines while forming the bit contact plugs 18$c$. Therefore, formation and etching of mask layer only for the bit contact plugs 18$c$ can be eliminated and simplifying the process thereby, compared with forming the bit contact plugs 18c and the bit lines individually.

Additionally, high-precision lithography and etching can be eliminated by forming the groove 17 and patterning the conductive material 18 embedded in the groove 17 as a method of forming the bit contact plugs 18c, instead of forming a contact hole and embedding the conductive material therein.

Figure 13A:
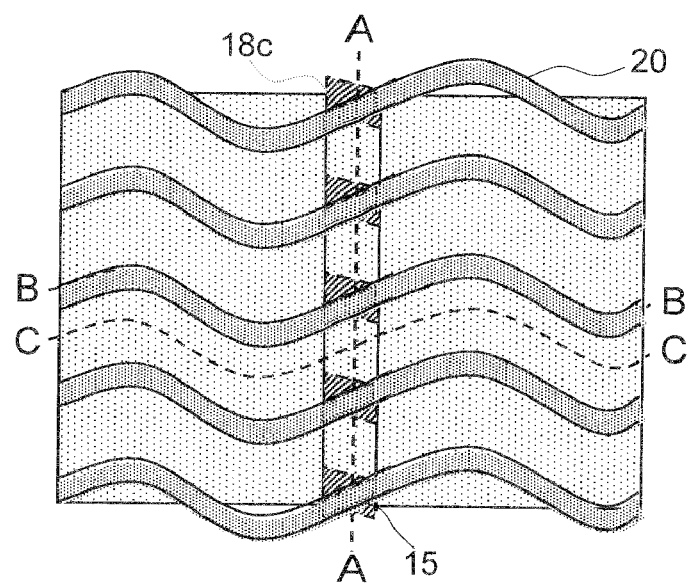
FIGS. 13A and 13B show a manufacturing process of the semiconductor device 100 (forming of wiring patterns 18w and second contact plugs 18c), where
Figure 13B:
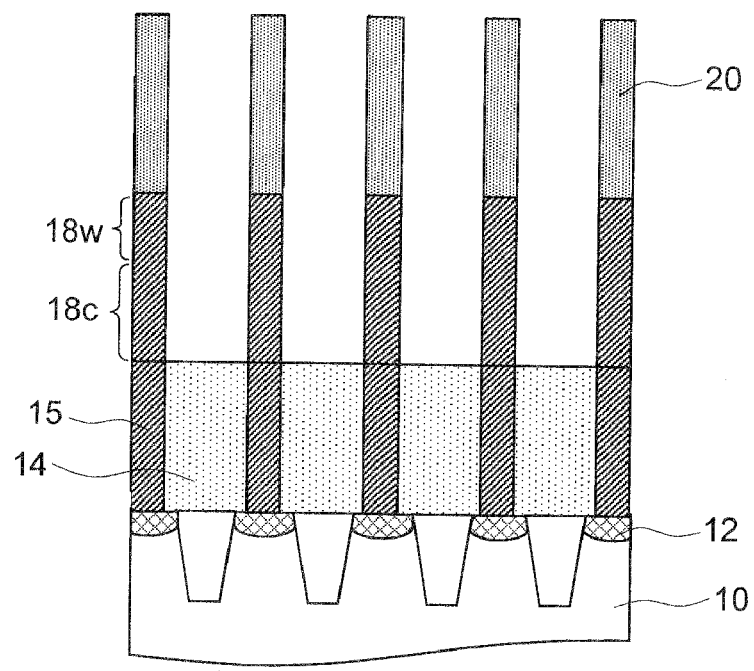
Figure 14A:
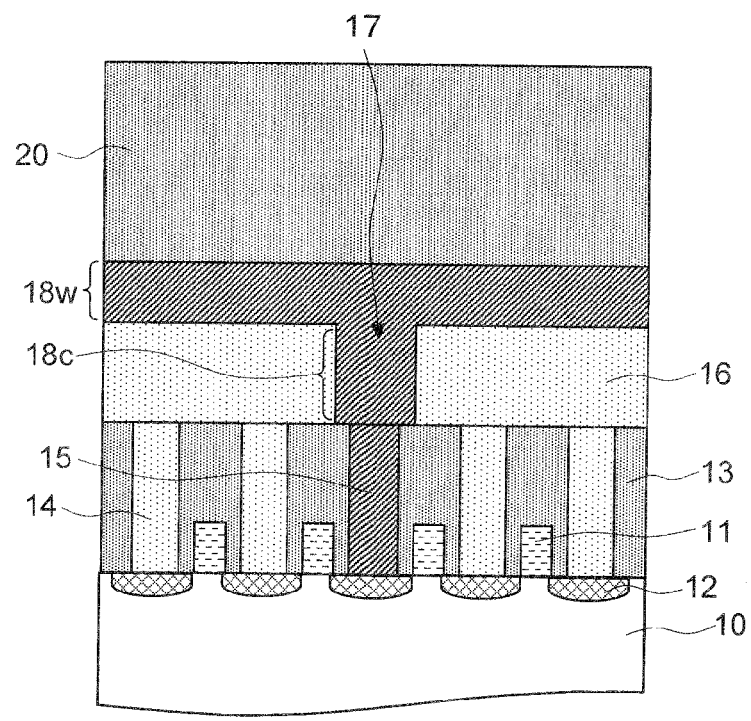
FIGS. 14A and 14B show the manufacturing process of the semiconductor device 100 (forming of the wiring patterns 18w and the second contact plugs 18c), where
Figure 14B:
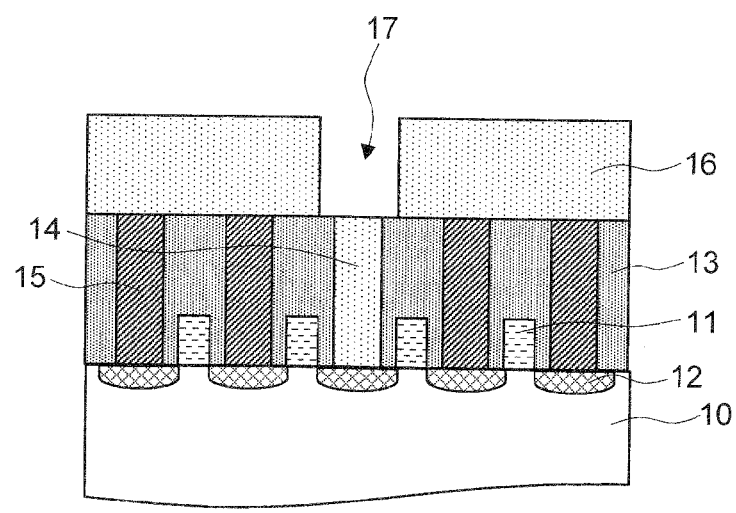
Figure 15:
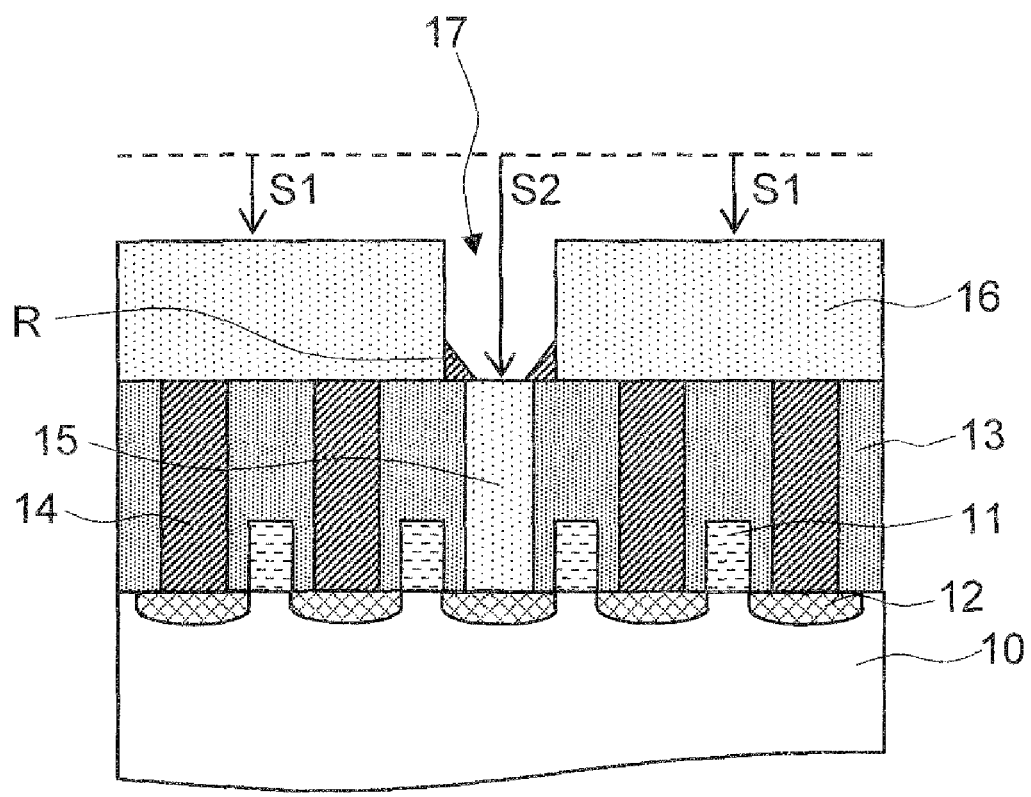
FIG. 15 is a schematic cross-sectional view for explaining a problem in the first embodiment.
Figure 16A:
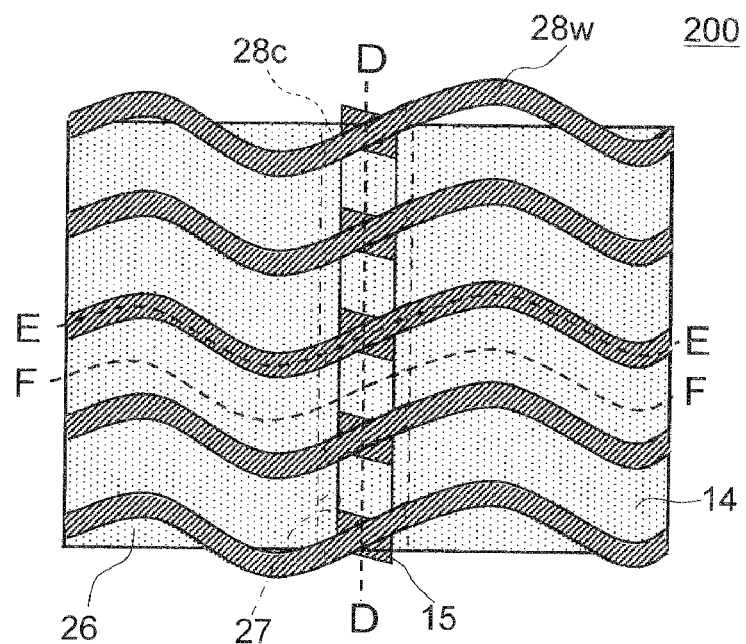
FIGS. 16A and 16B show the structure of a semiconductor device 200 according to a second embodiment of the invention, where
Figure 16B:
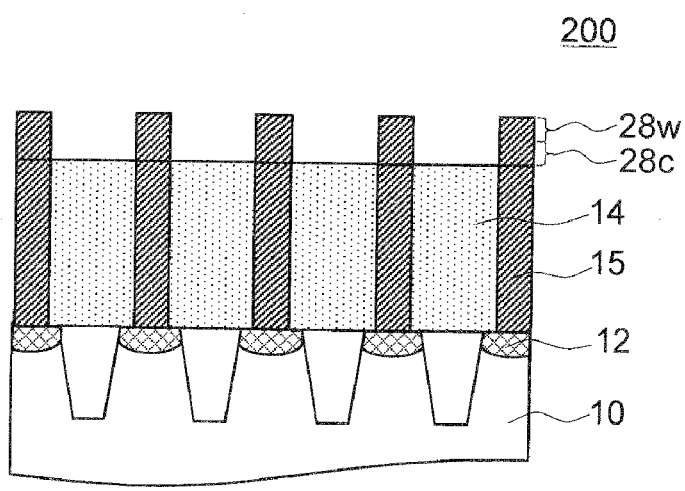
Figure 17A:
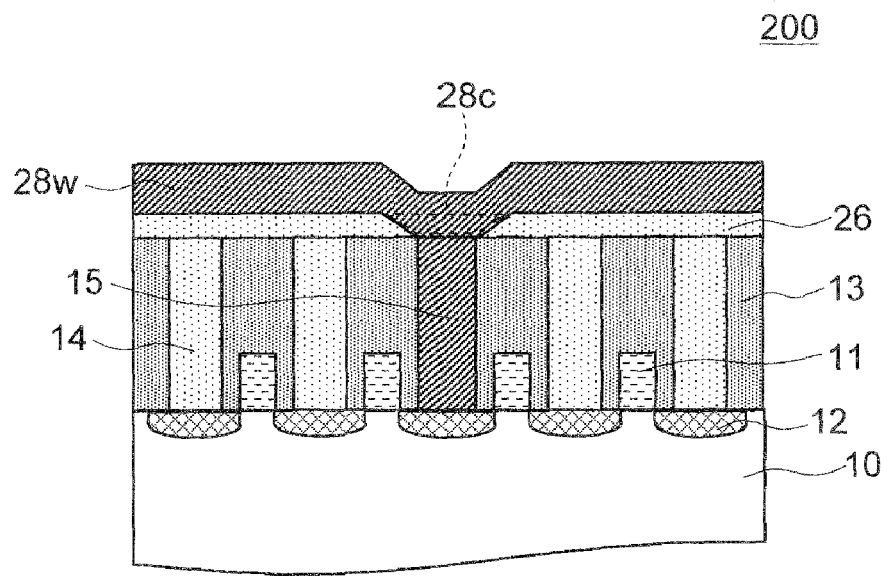
FIG. 17A is a schematic cross-sectional view along a line E-E in FIG. 16A.
Figure 17B:
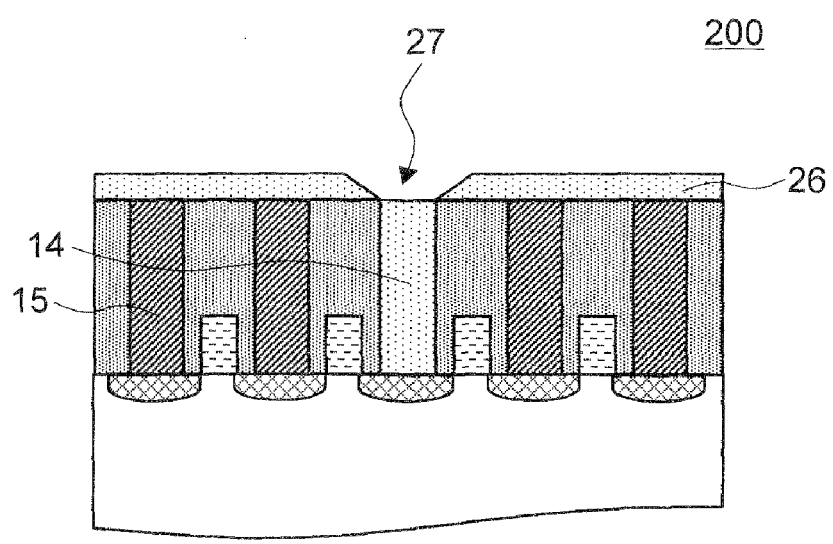
FIG. 17B is a schematic cross-sectional view along a line F-F in FIG. 16A.
Figure 18A:
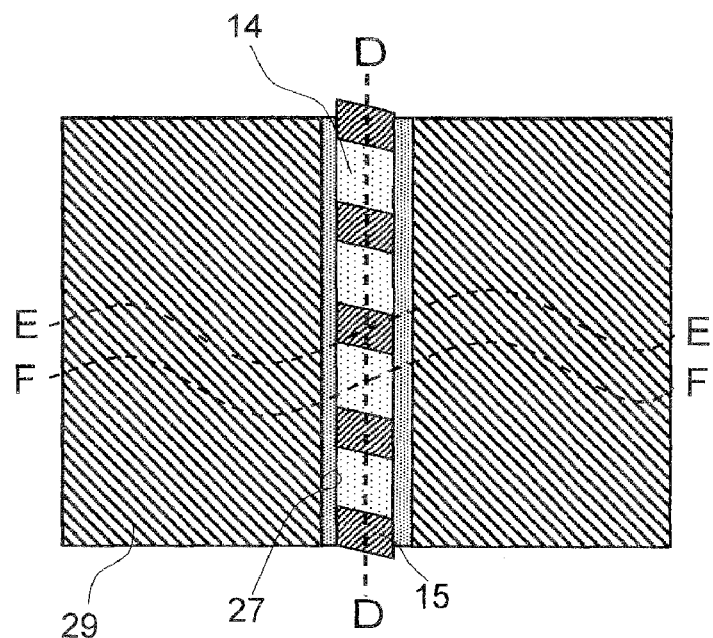
FIGS. 18A and 18B show a manufacturing process of the semiconductor device 200 (forming of a resist mask 29), where
Figure 18B:
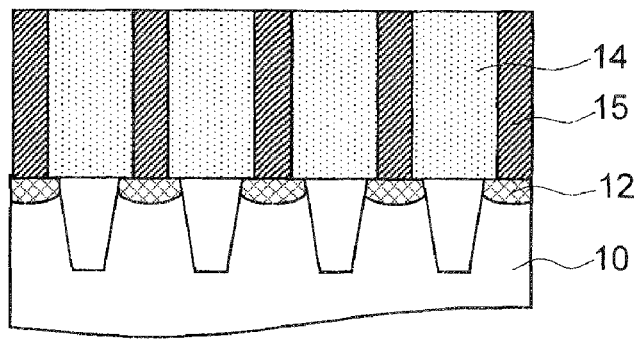
Figure 19A:
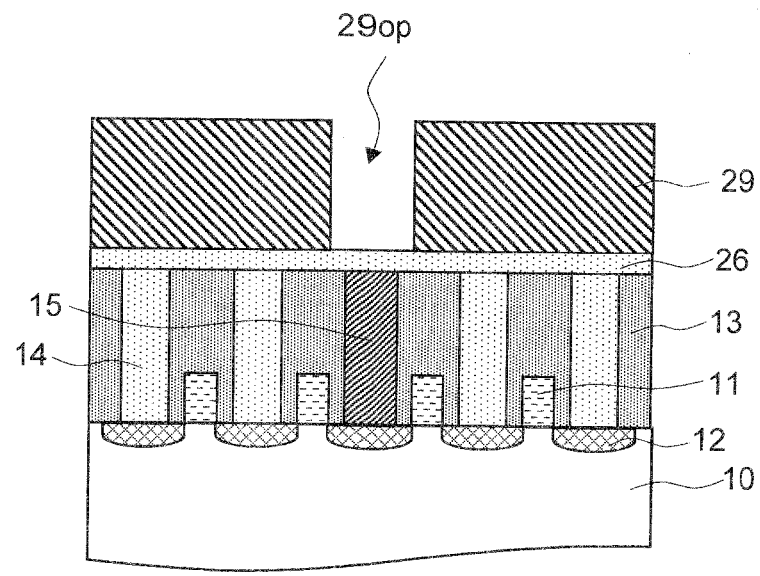
FIGS. 19A and 19B show the manufacturing process of the semiconductor device 200 (forming of the resist mask 29), where
Figure 19B:
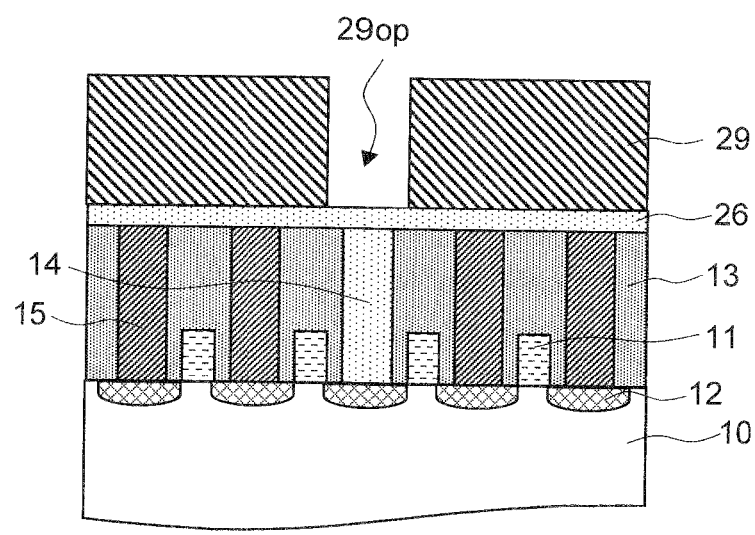
Figure 20A:
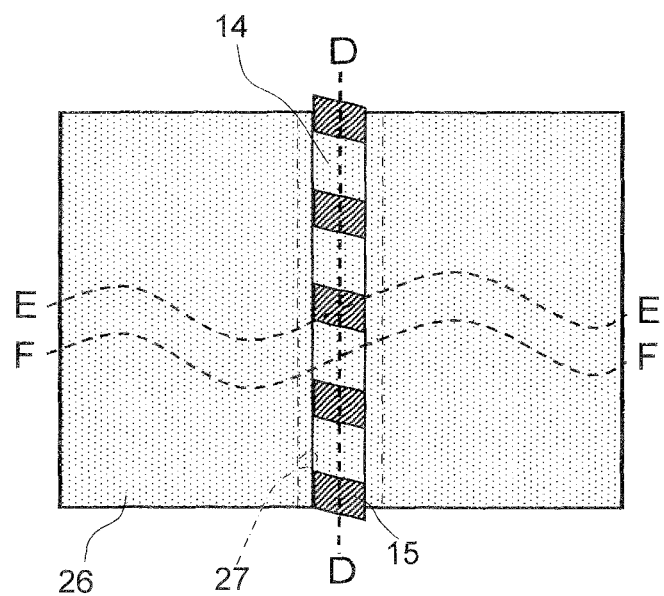
FIGS. 20A and 20B show a manufacturing process of the semiconductor device 200 (forming of a groove 27), where
Figure 20B:
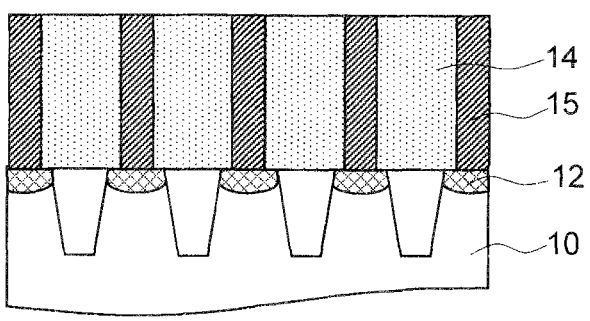
Figure 21A:
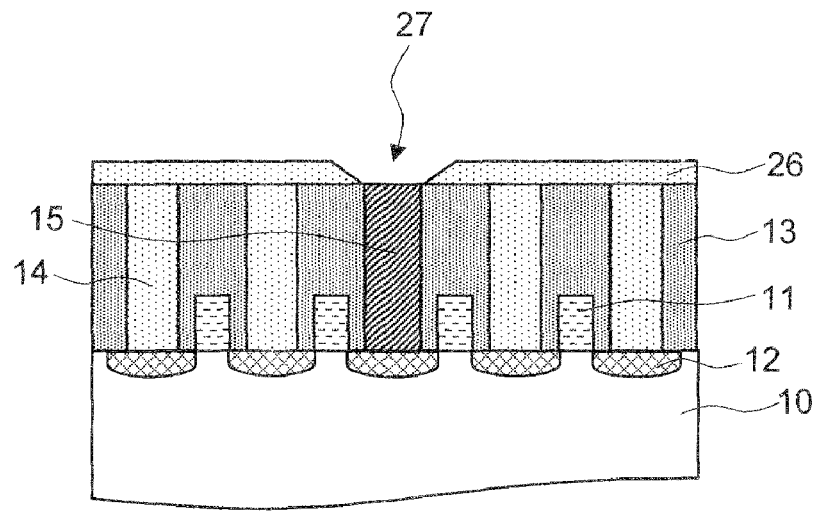
FIGS. 21A and 21B show the manufacturing process of the semiconductor device 200 (forming of the groove 27), where
Figure 21B:
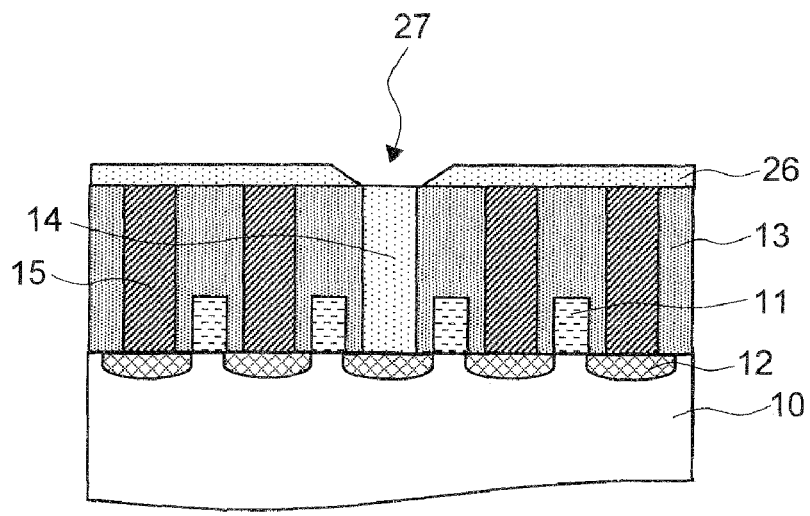
Figure 22A:
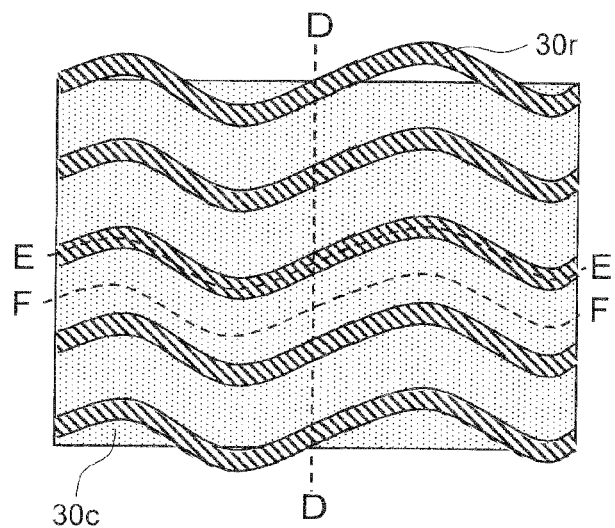
FIGS. 22A and 22B show a manufacturing process of the semiconductor device 200 (forming of an conductive material 28 and a mask layer 30), where
Figure 22B:
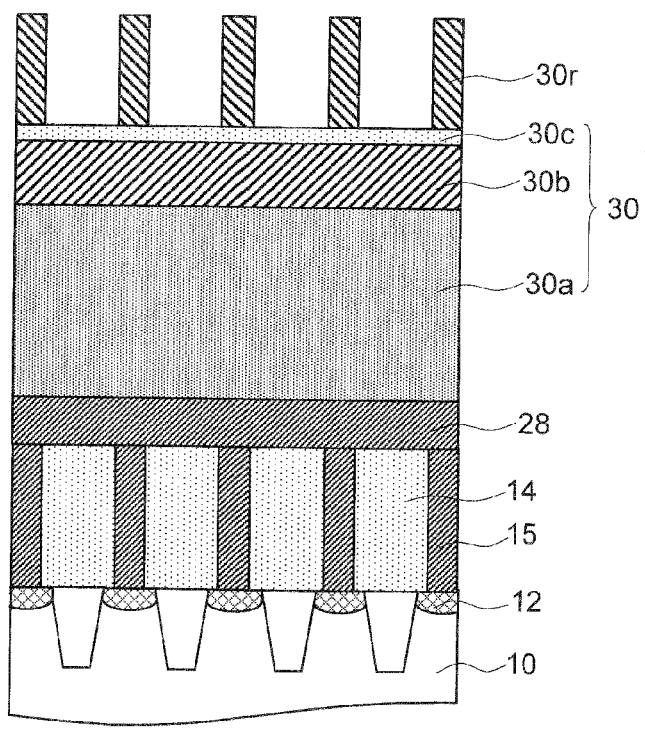
Figure 23A:
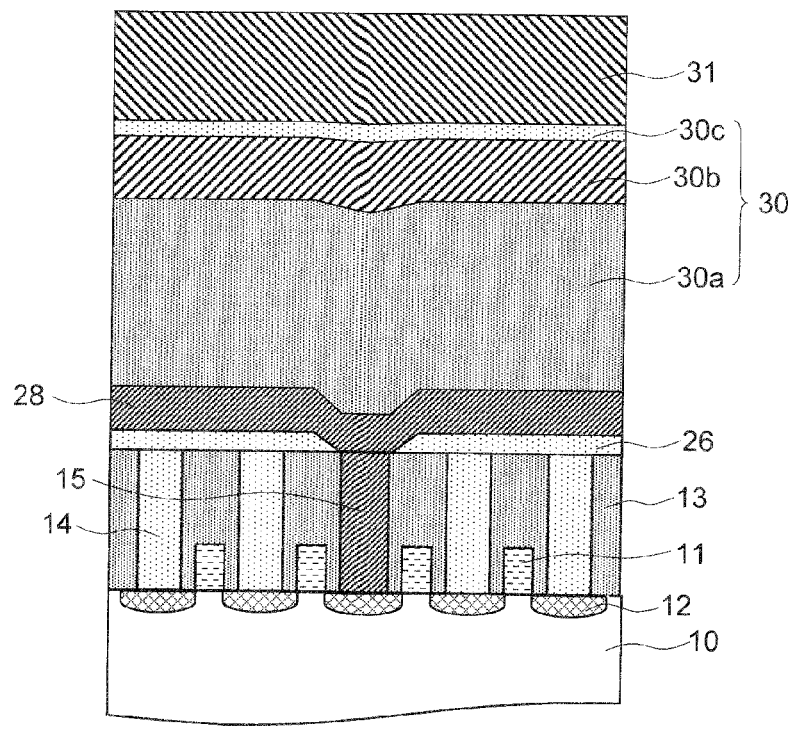
FIGS. 23A and 23B show the manufacturing process of the semiconductor device 200 (forming of the conductive material 28 and the mask layer 30), where
Figure 23B:
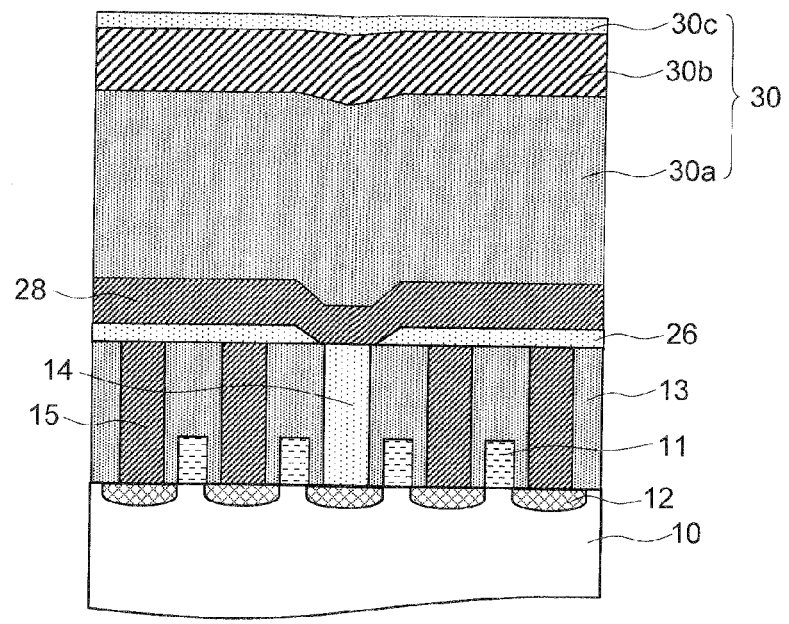
Figure 24A:
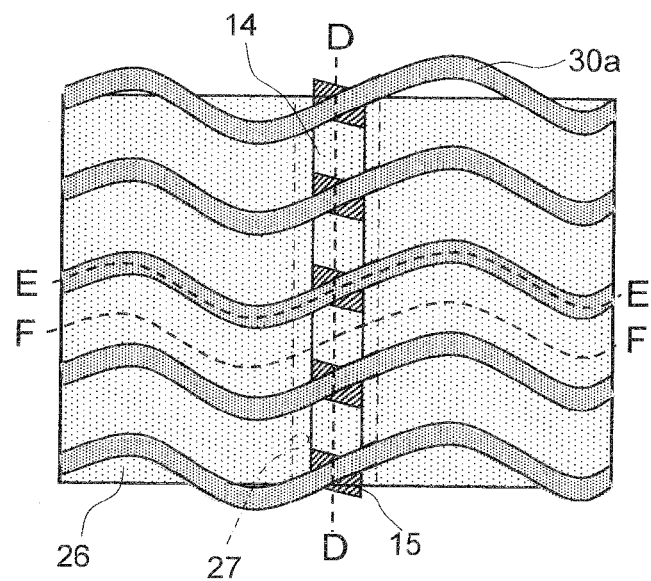
FIGS. 24A and 24B show a manufacturing process of the semiconductor device 200 (forming of wiring patterns 28w and second contact plugs 28c), where
Figure 24B:
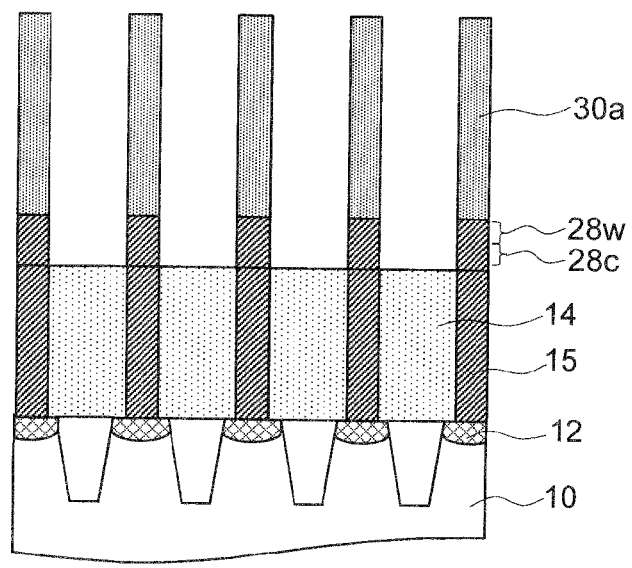
Figure 25A:
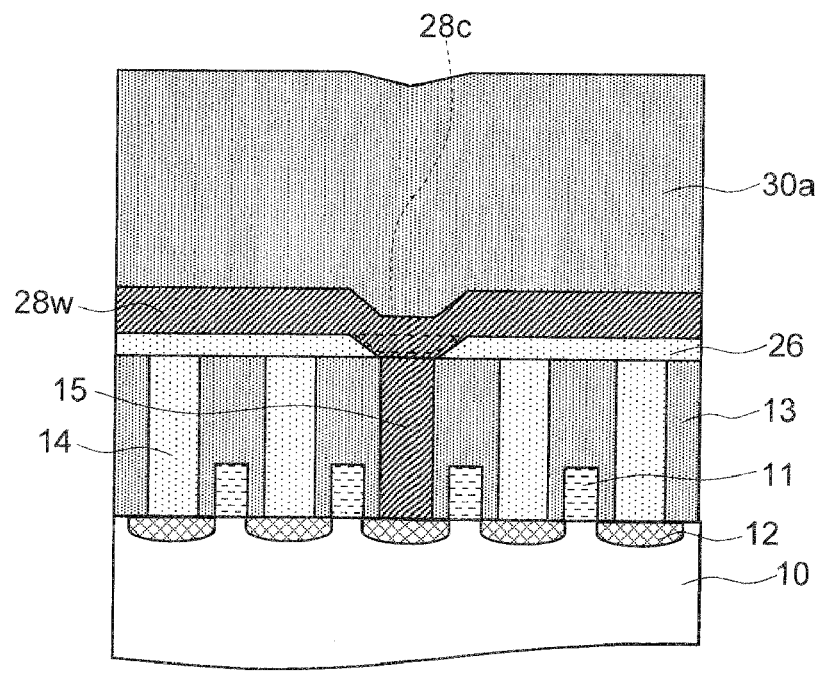
FIGS. 25A and 25B show the manufacturing process of the semiconductor device 200 (forming of the wiring patterns 28w and the second contact plugs 28c), where
Figure 25B:
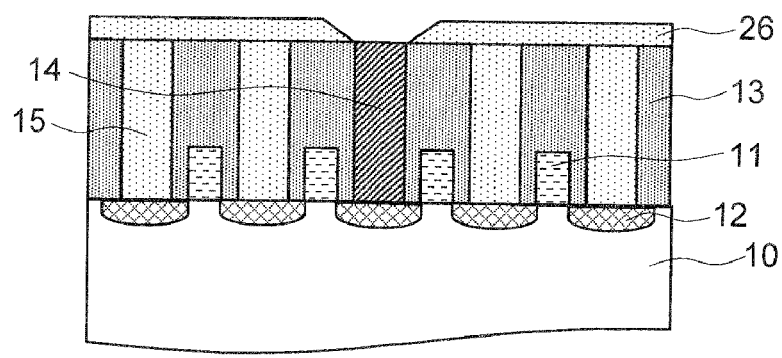
Figure 26A:
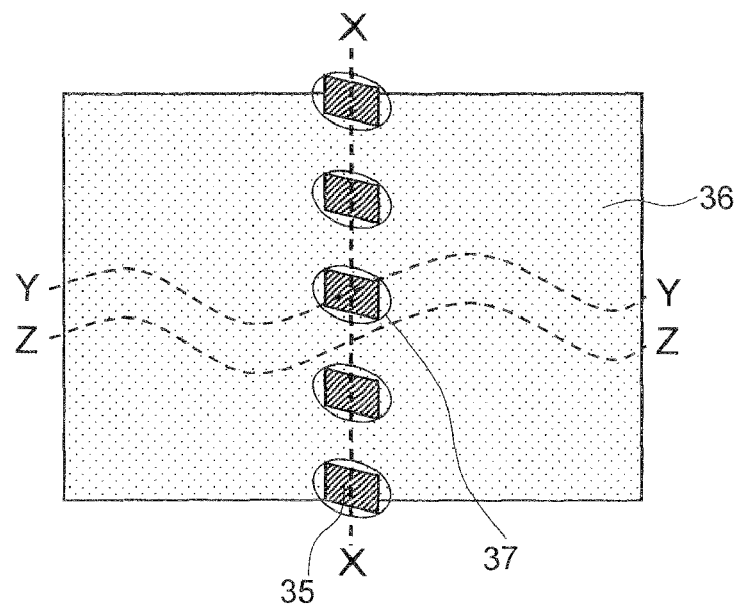
FIGS. 26A and 26B show a manufacturing process (forming of contact holes 37) for explaining a general method of connecting either the source regions or the drain regions to bit lines in a DRAM, where
Figure 26B:
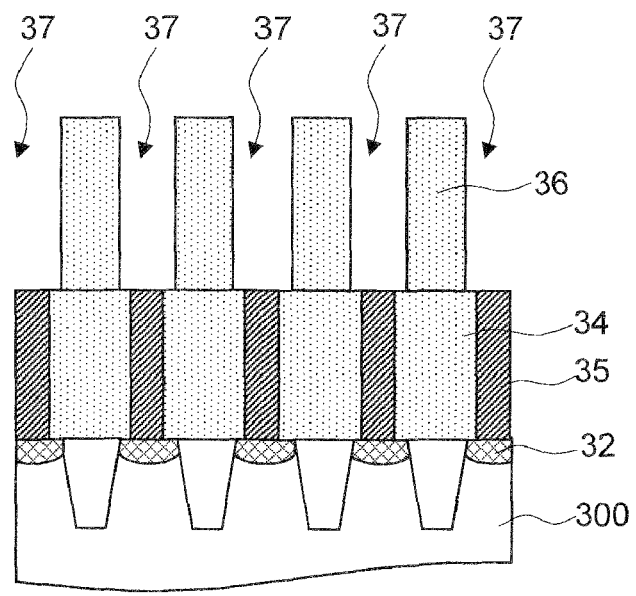
Figure 27A:
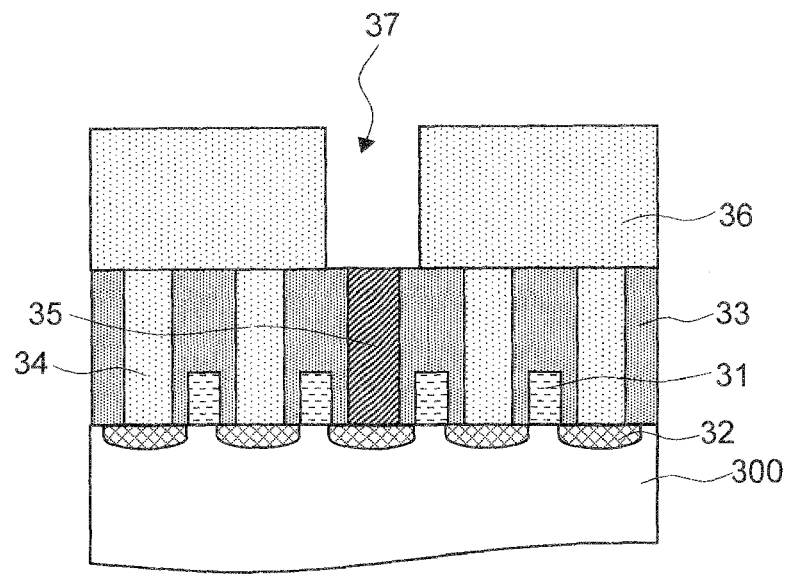
FIGS. 27A and 27B show the manufacturing process (forming of contact holes 37) for explaining the general method of connecting either the source regions or the drain regions to bit lines in a DRAM, where
Figure 27B:
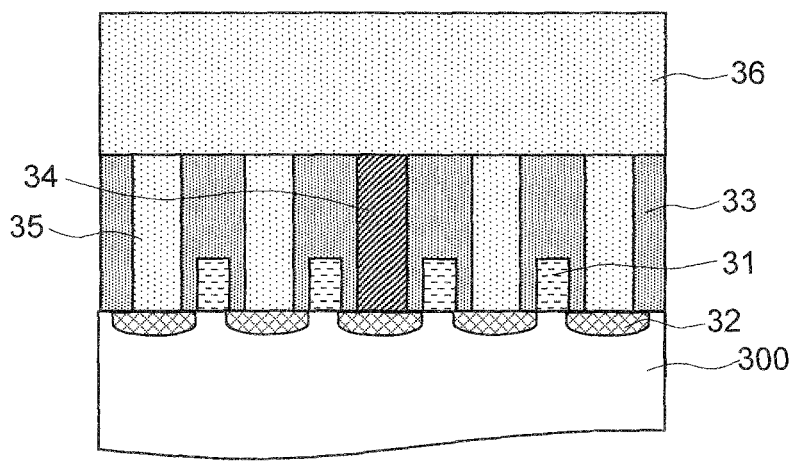
Figure 28A:
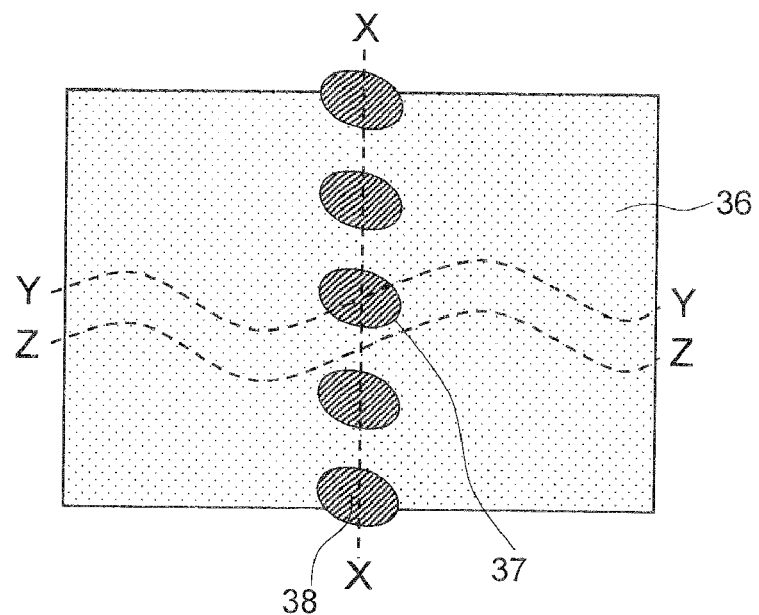
FIGS. 28A and 28B show a manufacturing process (forming of bit contact plugs 38) for explaining a general method of connecting either the source regions or the drain regions to bit lines in a DRAM, where
Figure 28B:
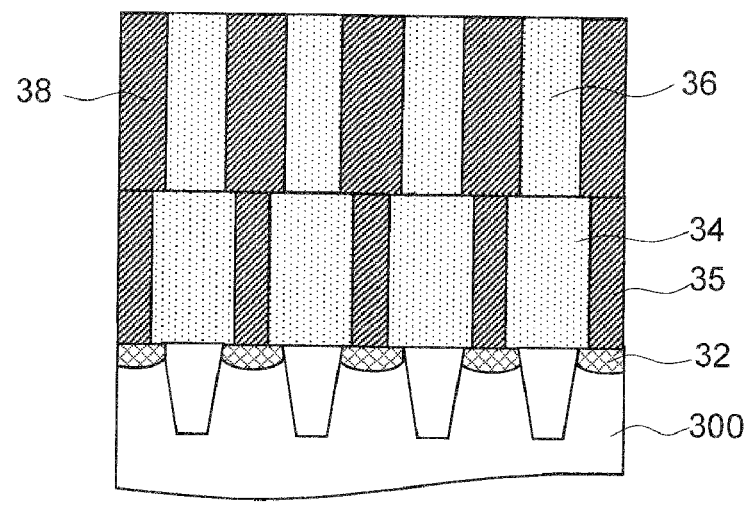
Figure 29A:
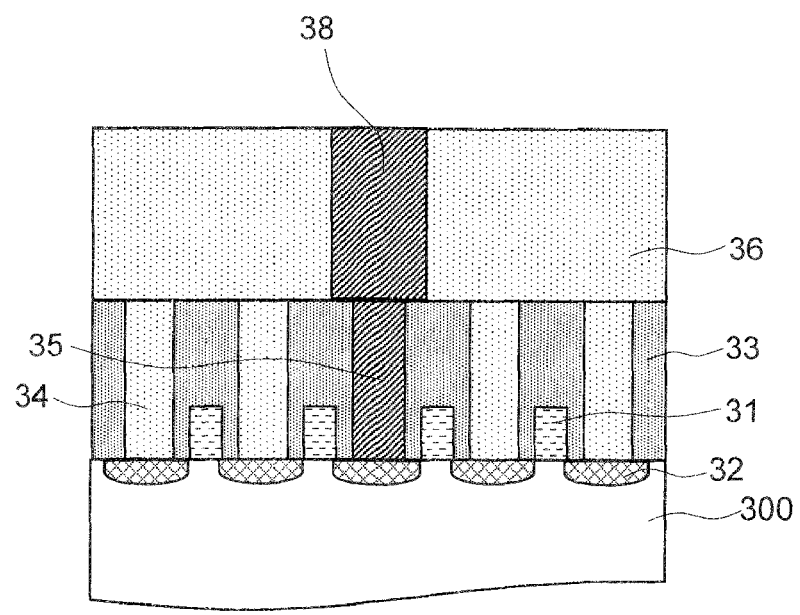
FIGS. 29A and 29B show the manufacturing process (forming of the bit contact plugs 38) for explaining the general method of connecting either the source regions or the drain regions to bit lines in a DRAM, where
Figure 29B:
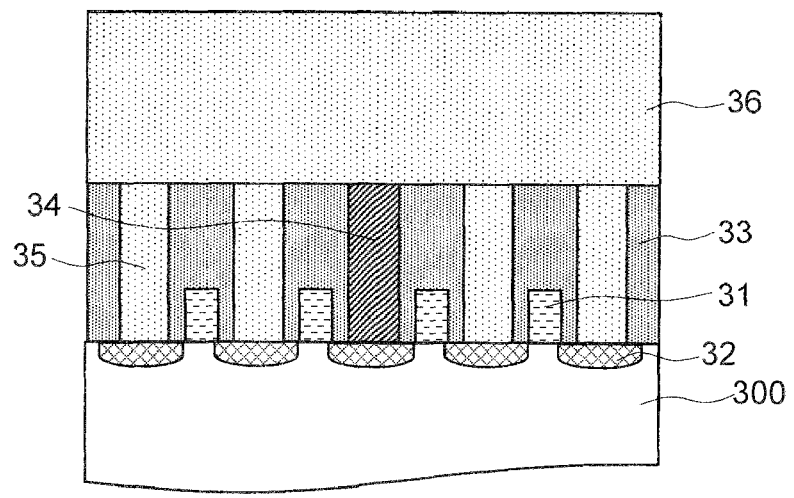
Figure 30A:
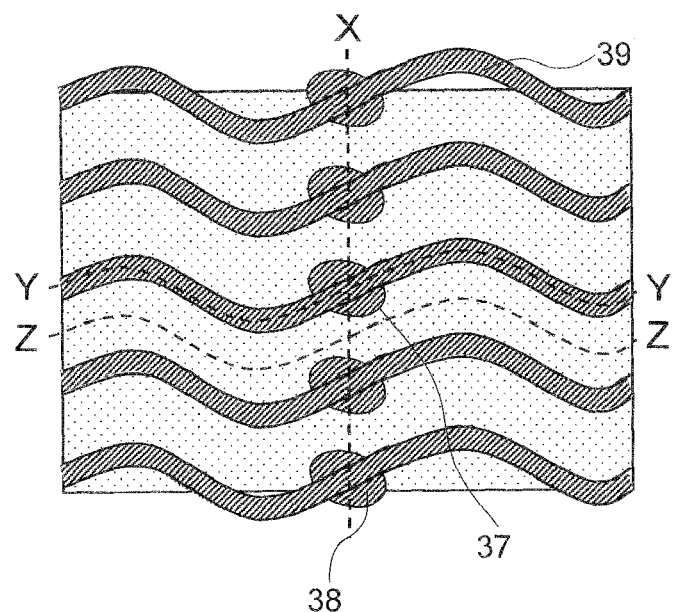
FIGS. 30A and 30B show a manufacturing process (forming of bit lines 39) for explaining a general method of connecting either the source regions or the drain regions to bit lines in a DRAM, where
Figure 30B:
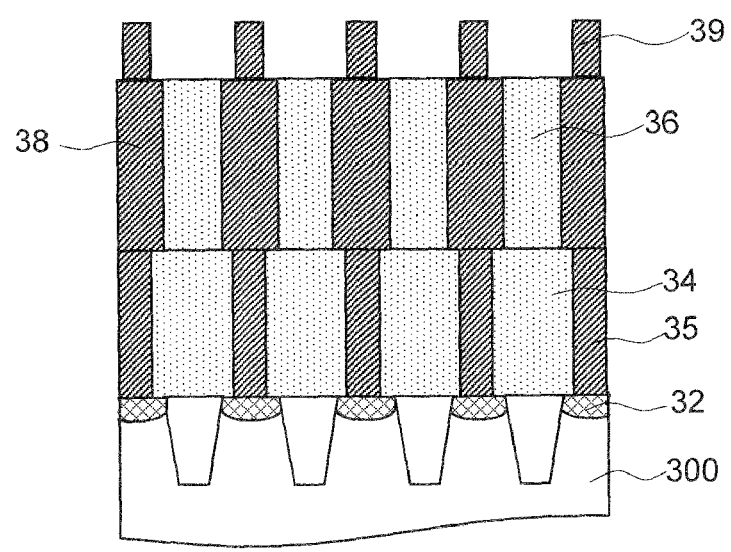
Figure 31A:
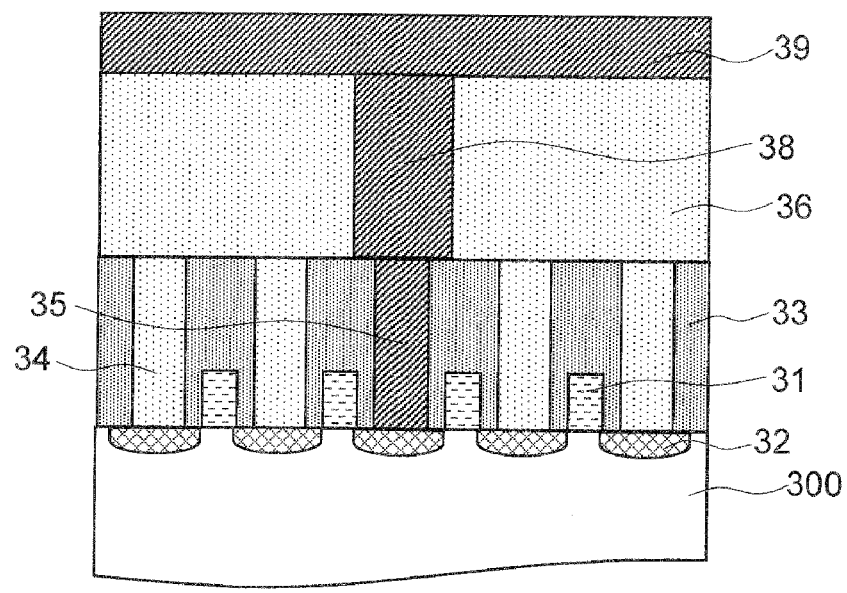
FIGS. 31A and 31B show the manufacturing process (forming of the bit lines 39) for explaining the general method of connecting either the source regions or the drain regions to bit lines in a DRAM, where
Figure 31B:
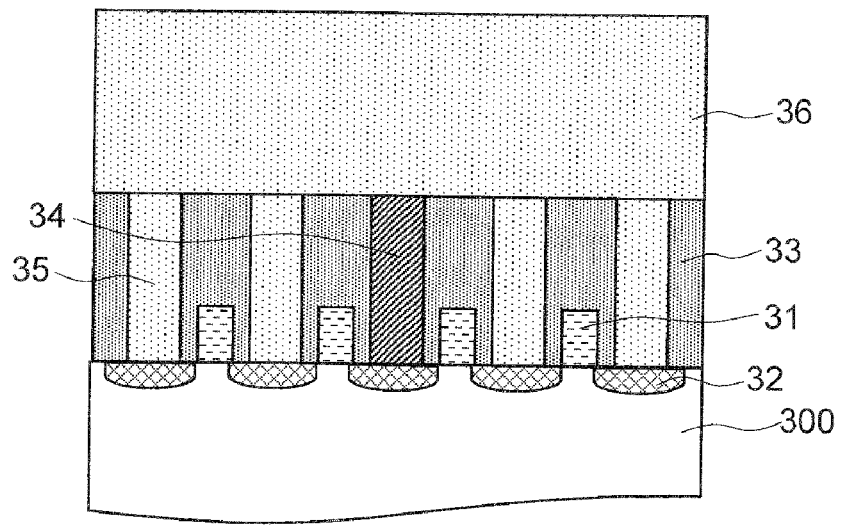

In the first embodiment, however, there are cases that the following problem arises, which are explained with reference to FIG. 15. FIG. 15 corresponds to the schematic cross-sectional view along a line C-C of FIG. 13A, showing the conductive material 18 after being patterned by etching.

In FIG. 15, the dashed line shows the position of the top surface of the conductive material 18 before etching the conductive material 18. In other words, it suffices to perform etching by a thickness of S1 over the inter-layer insulation film 16, as shown by the short arrow, when etching the conductive material 18. However, for the part of the groove 17, etching must be performed by a thickness of S2, which is the thickness of the inter-layer insulation film 16 plus the thickness of the conductive material 18 on the inter-layer insulation film 16, as shown by the long arrow. Accordingly, as shown in FIG. 15, etching residue R can be easily produced at the bottom of the groove 17.

A semiconductor device and a manufacturing method thereof for preventing the problem of etching residue in the first embodiment are described below as a second embodiment of the present invention.

Second Embodiment

FIGS. 16A, 16B, 17A and 17B show the structure of a semiconductor device 200 according to the second embodiment. The semiconductor device 200 according to the second embodiment is a DRAM. FIGS. 16A, 16B, 17A and 17B show the structure when the formation of its wiring patterns (bit lines) 28w is completed. In FIGS. 16A, 16B, 17A and 17B, the components same as the first embodiment are labeled with identical numerals and the description thereof are abbreviated.

As shown in FIGS. 16A, 16B, 17A and 17B, the semiconductor device 200 according to the second embodiment includes, a plurality of transistors having the gate electrodes 11 and the source regions and drain regions 12; the cap insulation film 13; the first inter-layer insulation film 14; and the first contact plugs (cell contact plugs) 15, which are formed on the semiconductor substrate 10.

A second inter-layer insulation film 26 is formed on the first inter-layer insulation film 14. The thickness of the second inter-layer insulation film 26 is about 20 to 40 nm, which is much thinner than that of the first embodiment. A groove 27 linearly extending in the same direction as the extending direction of the gate electrodes 11 and exposing the top surface of the first contact plugs 15 at a bottom thereof is formed on the second inter-layer insulation film 26. The groove 27 is tapered such that the width at the top is wider than the width at the bottom. The bottom width of the groove 27 is preferred to be approximately about the same or wider than the width of the top of the first contact plugs 15.

Wiring patterns 28w extend on the second inter-layer insulation film 26 so as to traverse the groove 27. In the groove 27, a plurality of second contact plugs (bit contact plugs) 28c are arranged spaced apart from each other with a predetermined interval, the second contact plugs 28c being formed integrally with the wiring patterns 28w. It is preferred that the second inter-layer insulation film 26 is thinner than the thickness of the wiring patterns 28w. With the second inter-layer insulation film 26 being thin and the groove 27 being tapered, the conductive material for use in forming the wiring patterns 28w and the second contact plugs 28c can be suitably embedded in the groove 27. The second contact plugs 28c and wiring patterns 28w are formed by the conductive material, where a W or W/WN film can be used, for example.

Because the groove 27 is very shallow in the second embodiment, it can be said that apart 28c of the wiring pattern 28w is connected to the cell contact plug 15, without distinguishing the bit contact plug 28c and the wiring pattern 28w.

The manufacturing method of the semiconductor device 200 according to the second embodiment is explained below.

FIGS. 18A to 25B are process diagrams for explaining the manufacturing method of semiconductor device 200 according to the second embodiment, where FIGS. 18A, 20A, 22A, and 24A are schematic plan views in each process, FIGS. 19B, 21B, 23B, and 25B are schematic cross-sectional views taken along a line D-D in each of the plan views, FIGS. 19A, 21A, 23A, and 25A are schematic cross-sectional views taken along a line E-E in each of the plan views, and FIGS. 19B, 21B, 23B, and 25B are schematic cross-sectional views taken along a line F-F in each of the plan views.

FIGS. 18A, 18B, 19A and 19B show the processes following those of FIGS. 3A, 3B, 4A and 4B in the first embodiment.

As shown in FIGS. 18A, 18B, 19A and 19B, the second inter-layer insulation film 26 having a thickness of about 20 to 40 nm is formed on the first inter-layer insulation film 14. Subsequently, a resist mask 29 is formed on the second inter-layer insulation film 26. The resist mask 29 is formed so as to have a groove-like opening 29op located over the cell contact plugs 15.

Subsequently, by patterning the second inter-layer insulation film 26 using the resist mask 19, the groove 27 linearly extending in the same direction as an extending direction of the gate electrodes 11 and exposing the top surface of the first contact plugs 15 at a bottom thereof is formed in the second inter-layer insulation film 26, as shown in FIGS. 20A, 20B, 21A and 21B. By controlling the etching condition when patterning the second inter-layer insulation film 26, the groove 27 is formed to be tapered, with the width at the top being wider than the width at the bottom. Such a tapered groove 27 can be formed by the following method, for example. After etching the silicon dioxide film working as the second inter-layer insulation film 26 by plasma dry etching under a condition of $C_4F_8/O_2/Ar=20/20/400$ sccm, 5 Pa, RF13.56 MHz, 1000 W, and exposing the top surface of the cell contact plug 15, the etching gas is changed to $O_2/Ar=100/100$ sccm and the groove is processed into a tapered shape using the sputtering effect on the silicon dioxide film 26 while removing the resist mask 29.

As shown in FIGS. 22A, 22B, 23A and 23B, the conductive material 28 is formed in the groove 27 and on the second inter-layer insulation film 26. A W/WN film having a thickness of 40/10 nm is formed as the conductive material 28. It is preferred that the second inter-layer insulation film 26 is thinner than the thickness of the conductive material 28. Because the groove 27 is shallow and tapered, the W/WN film can be easily embedded in the groove 27, even if PVD (Physical Vapor Deposition) is used, for example.

In order to form a mask layer 30 for processing the conductive material 28, subsequently, a silicon nitride film 30a, an α-C (amorphous carbon) film 30b, and a silicon oxynitride film (SiON film) 30c are formed, each with a thickness of 150, 250, and 50 nm, upon which a resist mask 30r is formed in a wiring pattern. After etching the SiON film 30c by a known plasma etching method using the resist mask 30r as a mask and removing the resist mask 30r, the gas is changed to that having O₂ as its major component and the α-C film 30b is etched using the SiON film 30c as a mask. The gas is further changed to freon or the like, and the silicon nitride film 30a is etched using the α-C film 30b as a mask. After having removed the α-C film 30b, the W/WN film 28 is plasma-etched by gas having Cl₂ as its major component, using the silicon nitride film 30a as a mask, as shown in FIGS. 24A, 24B, 25A and 25B. Because the groove 27 is tapered, the W/WN film 28 embedded in the groove 27 can be easily etched. Thus, the conductive material 28 that has been linear within the groove 27 is separated to form bit contact plugs 28c, and simultaneously wiring patterns (bit lines) 28w is formed. Because the bit lines 28w and the bit contact plugs 28c are formed in such a manner, they are integrally formed.

By removing the silicon nitride film 30a working as the mask layer, the structure shown in FIGS. 16A, 16B, 17A and 17B can be obtained.

According to the second embodiment, a similar effect as with the first embodiment is obtained and generation of etching residue in the groove 27 can be prevented because the depth of groove 27 is shallow (the thickness of the second inter-layer insulation film 26 is thin) and tapered, facilitating etching within the groove 27 when patterning the conductive material 28.

It is apparent that the present invention is not limited to the above embodiments, but may be modified and changed without departing from the scope and spirit of the invention.

Although an example is described in the first embodiment that uses the silicon nitride film 20 as a mask layer for etching the conductive material 18, and an example is described in the second embodiment using a laminated film of the silicon nitride film 30a, α-C film 30b, and silicon oxynitride film 30c as the mask layer 30 for etching the conductive material 28, it is also possible that the laminated film used in the second embodiment, or other types of masks are used in the first embodiment as the mask layer. It is preferred to suitably select the material of the mask layer according to the patterning condition or the like.

Although an example is shown using PVD to form the W/WN film working as the conductive material 28 in the second embodiment, the invention is not limited thereto and obviously other film forming methods such as CVD can also be used.

What is claimed is:

1. A method comprising:
   forming a plurality of conductive regions substantially in line in a first direction;
   covering the conductive regions with an insulating layer;
   selectively removing the insulating layer to form an opening therein, the opening being elongated in the first direction to continuously expose respective parts of the conductive regions;
   depositing a conductive layer over the insulating layer and in the opening, the conductive layer thereby including a projection correspondently to the opening, the projection including a plurality of contact portions each being in electrical contact with an associated one of the respective parts of the conductive regions; and
   patterning the conductive layer to form a plurality of interconnection lines separately from each other, each of the interconnection lines crossing the opening of the insulating layer and extending in a second direction that crosses the first direction, and each of the interconnection lines including an associated one of the contact portions of the projection.

2. The method as claimed in claim 1, wherein the opening is formed with downwardly tapered so that each of the contact portions of the interconnection lines is downwardly tapered.

3. The method as claimed in claim 1, wherein the forming the conductive regions comprises:
   forming an interlayer insulating film over a substrate;
   forming a plurality of contact holes in the interlayer insulating film; and
   forming a plurality of contact plugs in the contact holes, respectively, the contact plugs serving as the conductive regions.

4. The method as claimed in claim 1, wherein each of the contact portions is substantially defined in the first direction by a width of an associated one of the interconnection lines and in the second direction by a width of the opening.

5. The method as claimed in claim 1, wherein the second direction is substantially perpendicular to the first direction.

6. The method as claimed in claim 1, wherein the forming the plurality of conductive regions comprises:
   forming a plurality of diffusion regions in a semiconductor substrate, the diffusion regions being substantially in line in the first direction;
   forming an interlayer insulating film over the semiconductor substrate including the diffusion regions;
   forming a plurality of contact holes in the interlayer insulating film, each of the contact holes exposing at least a part of an associated one of the diffusion regions; and
   forming a plurality of contact plugs in the contact holes, respectively, each of the contact plugs serving as an associated one of the conductive regions and being in contact with the part of an associated one of the diffusion regions through an associated one of the contact holes.

7. A method comprising:
   forming a plurality of transistors, each of the transistors including a diffusion region, the transistor being disposed such that diffusion regions thereof are arranged substantially in line in a first direction;
   covering the transistors with an insulating layer;
   selectively removing the insulating layer to form a trench therein, the trench extending in the first direction so that respective parts of the diffusion regions of the transistors are included in the trench;
   forming continuously a conductive layer over the insulating layer and in the trench, the conductive layer comprising a first portion over the insulating layer and a second portion in the trench; and
   patterning the conductive layer to divide the first portion into a plurality of interconnection lines and the second portion into a plurality of plug portions at one time, each of the plug portions being electrically connected to an associated one of the diffusion regions of the transistors, and each of the interconnection lines being elongated from an associated one of the plug portions and running over the insulating layer in a second direction crossing the first direction.

8. The method as claimed in claim 7, wherein the covering the transistors with the insulating layer comprises:
   forming an interlayer insulating film over the transistors;
   forming a plurality of contact plugs in the interlayer insulating film, each of the contact plugs being in electrical contact with an associated one of the diffusion regions of the transistors; and
   forming the insulating layer over the interlayer insulating film having the contact plugs.

9. The method as claimed in claim 7, wherein the trench is formed in a downwardly tapered shape so that each of the plug portions is downwardly tapered.

10. The method as claimed in claim 7, wherein each of the transistors serves as a memory cell transistor and each of the interconnection lines serves as bit line.

11. The method as claimed in claim 8, wherein the trench is formed to expose at least a part of the contact plugs, and each of the plug portions being in contact with an associated one of the part of the contact plugs.

12. A method comprising:
forming a plurality of word lines in substantially parallel to each other;
forming a plurality of memory cell transistors each including a part of an associated one of the word lines as a gate thereof, each of the memory cell transistors including a first diffusion region to which a bit line is connected; the memory cell transistors being divided into a plurality of groups, the first diffusion regions of the memory cell transistors that belong to an identical one of the groups being arranged substantially in line in a first direction;
forming an insulating layer over the word lines and the memory cell transistors;
forming a plurality of trenches in the insulating layer, each of the trenches being in a line shape and extending in the first direction to position over the first diffusion regions of the memory cell transistors of an associated one of the groups;
forming a conductive layer over the insulating layer and in the trenches, the conductive layer including a plurality of projections, each of the projections being in a line shape and extending in the first direction corresponding to an associated one of the trenches; and
patterning the conductive layer to form a plurality of bit lines and to divide each of the projections into a plurality of bit contact plugs at one time, each of the bit lines extending in a second direction that crosses the first direction and including associated ones of the bit contact plugs, each of the bit lines being electrically connected through the associated ones of the bit contact plugs to the first diffusion regions of the memory cell transistors that belong to different ones of the groups.

13. The method as claimed in claim 12, wherein each of the memory cell transistors includes a second diffusion region, and the method further comprises covering the bit lines with a first interlayer insulating film and forming a plurality of capacitors over the first interlayer insulating film, each of the capacitors being electrically connected to an associated one of the second diffusion regions of the memory cell transistors.

14. The method as claimed in claim 12, wherein the forming the insulating layer over the word lines and the memory cell transistors comprises:
covering the word lines and the memory cell transistors with a second interlayer insulating film;
forming a plurality of plugs in the second interlayer insulating layer, each of the plugs being in electrical contact with an associated one of the first diffusion regions of the transistors; and
forming the insulating layer over the first interlayer insulating film having the plugs.

15. The method as claimed in claim 12, wherein each of the trenches is downwardly tapered to downwardly taper each of the bit contact plugs.

16. The method as claimed in claim 13, wherein the forming the insulating layer over the word lines and the memory cell transistors comprises:
covering the word lines and the memory cell transistors with a second interlayer insulating film;
forming a plurality of first plugs and a plurality of second plugs in the second interlayer insulating film, each of the first plugs being in electrical contact with an associated one of the first diffusion regions of the transistors, each of the second plugs being in electrical contact with an associated one of the second diffusion regions; and
forming the insulating layer over the first interlayer insulating film having the first and second plugs.

\* \* \* \* \*